(12) United States Patent
Karam

(10) Patent No.: US 9,094,339 B2
(45) Date of Patent: Jul. 28, 2015

(54) COMPUTER SYSTEM COMMUNICATION CHANNEL DIAGNOSTICS

(75) Inventor: Roger Antoine Karam, Mountain View, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 568 days.

(21) Appl. No.: 13/460,569

(22) Filed: Apr. 30, 2012

(65) Prior Publication Data

US 2013/0286864 A1 Oct. 31, 2013

(51) Int. Cl.
*H04L 12/24* (2006.01)
*H04L 12/26* (2006.01)

(52) U.S. Cl.
CPC ............ *H04L 41/5067* (2013.01); *H04L 43/10* (2013.01); *H04L 43/50* (2013.01)

(58) Field of Classification Search
None
See application file for complete search history.

(56) References Cited

U.S. PATENT DOCUMENTS

| | | | |
|---|---|---|---|
| 4,858,224 A | 8/1989 | Nakano et al. | |
| 6,236,645 B1 | 5/2001 | Agazzi | |
| 6,512,746 B1 | 1/2003 | Sand | |
| 7,593,315 B2 | 9/2009 | Barrass | |
| 8,798,123 B2 * | 8/2014 | Terauchi | 375/224 |
| 2001/0026150 A1 | 10/2001 | Klenner | |
| 2003/0007581 A1 | 1/2003 | Agazzi et al. | |
| 2003/0194001 A1 | 10/2003 | Barksdale, Jr. | |
| 2004/0095921 A1 | 5/2004 | Kerpez | |
| 2004/0184518 A1 | 9/2004 | Agazzi | |
| 2004/0184620 A1 | 9/2004 | Johnson et al. | |
| 2004/0251913 A1 | 12/2004 | Pharn et al. | |
| 2005/0063479 A1 | 3/2005 | Propp et al. | |
| 2005/0174926 A1 | 8/2005 | Barrass | |
| 2008/0013110 A1 | 1/2008 | Wozniak et al. | |
| 2011/0090939 A1 * | 4/2011 | Diener et al. | 375/136 |
| 2013/0260705 A1 * | 10/2013 | Stratford | 455/226.1 |

OTHER PUBLICATIONS

Kavehrad et al., "10Gbps Transmission over Standard Category-5 Copper Cable," Globecom 2003, Dec. 1-5, 2003, San Francisco, CA; pp. 4106-4110; 0-7803-7974-8/03, © 2003 IEEE; 5 pages.
Jones, William, "10GBASE-T Tutorial Overview," Solaflare Communications; pp. 1-34; Jan. 2003 XP-002340260; 34 pages.

* cited by examiner

*Primary Examiner* — Kerri Rose
(74) *Attorney, Agent, or Firm* — Patent Capital Group

(57) ABSTRACT

A method provided in one example includes inserting a first common-mode signal into a first communication channel from a communication node, monitoring differential-mode noise in at least one communication channel due to the first common-mode signal, determining whether the differential-mode noise is acceptable, and generating a user notification if the differential-mode noise is not acceptable. In further embodiments, the at least one communication channel comprises one or more communication channels adjacent the first communication channel, and the method further includes determining whether the differential-mode noise due to the first common-mode signal is acceptable on the adjacent channels. In further embodiments, the method comprises sending a port identifier through the first communication channel before initiating the insertion. In more specific embodiments, the first common-mode signal comprises a signature that distinguishes the differential-mode from data on the at least one adjacent communication channel.

37 Claims, 26 Drawing Sheets

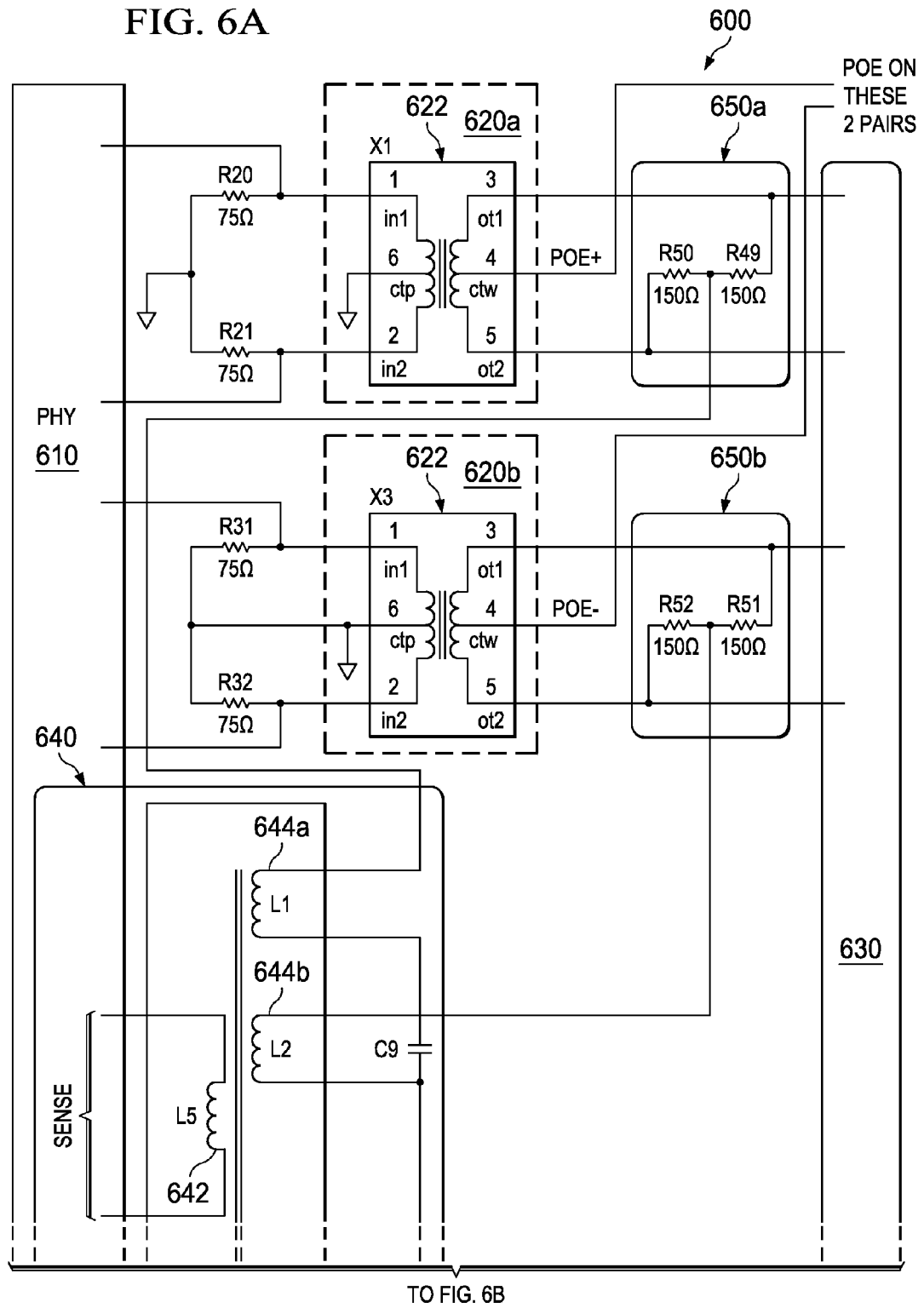

COMPUTER SYSTEM COMMUNICATION CHANNEL DIAGNOSTICS

TECHNICAL FIELD

The present disclosure relates generally to communication channels and, more specifically, to computer system communication channel diagnostics.

BACKGROUND

High-speed technology that uses twisted-pair cabling (whether unshielded of shielded) may be susceptible to common-mode noise, which is generated in the environment (e.g., from cell phones and radios). The noise may be picked up by the network cables acting like antennae, or conducted through noise on system grounds, which find their way into the cable via the center tap of the data transformer (or through magnetic coupling along the channel). The noise coupled onto each wire in the cable is then converted to a differential voltage (Vdnoise). This conversion can be referred to as C2D (common-to-differential). Additionally, as the common-mode signal travels down the cable, it can be reflected due to impedance discontinuity in connectors and cables.

Signal integrity hazards contribute to Vdnoise, which mixes with the traveling differential data along the cable. Vdnoise may interfere with the recovery of differential data transmitted on each pair. An Ethernet cable, for example, typically has four pairs, and each pair is driven in a differential manner. While the noise in this case starts in a common-mode fashion, the imbalances in the channel convert the noise to a differential signal and cause data corruption and link impairments in some cases. Differential signaling may, for example, be occurring at ±1 Volt. Theoretically, the noise is coupled from a source onto all pairs in a cable, but even a single pair with common-mode noise on it can deliver the common-mode noise along with a differential error noise onto the other pairs in the cable/connectors. Connectors are a large issue since they are not necessarily designed to work at high frequencies, where imbalances in the connectors are the main cause of C2D conversion.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 6A-B are schematic diagrams illustrating another example system for communication channel diagnostics.

DETAILED DESCRIPTION OF EXAMPLE EMBODIMENTS

Overview

A method in an example embodiment includes inserting a first common-mode signal into a first communication channel from a communication node. The term 'inserting' in this context can include placing, provisioning, including, or otherwise positioning the signal for subsequent propagation. The method also includes monitoring (which can include tracking, inspecting, examining, observing, etc.) differential-mode noise in at least one communication channel due to the first common-mode signal, and determining whether the differential-mode noise is acceptable (e.g., meets a certain level, measures at a certain quantity, is tolerable for certain architectures, meets a certain threshold, meets a certain standard, is compatible for certain environments, or certain types of communications, etc.). The method further includes generating a user notification if the differential-mode noise is not acceptable. In further embodiments, the at least one communication channel comprises one or more communication channels adjacent the first communication channel, and the method further includes determining whether the differential-mode noise due to the first common-mode signal is acceptable on the adjacent channels. In further embodiments, the method comprises sending a port identifier through the first communication channel before initiating the insertion. In more specific embodiments, the first common-mode signal comprises a signatures that allows the differential-mode noise to be distinguished from data on the at least one communication channel.

In more particular embodiments, the method includes inserting a second common-mode signal into a second communication channel, monitoring differential-mode noise in the second communication channel due to the second common-mode signal, and monitoring differential-mode noise in at least one communication channel adjacent the second communication channel due to the second common-mode signal. This particular embodiment also includes determining whether differential-mode cross talk between the second communication channel and the at least one adjacent communication channel is acceptable.

Example Embodiments

Figure 1:
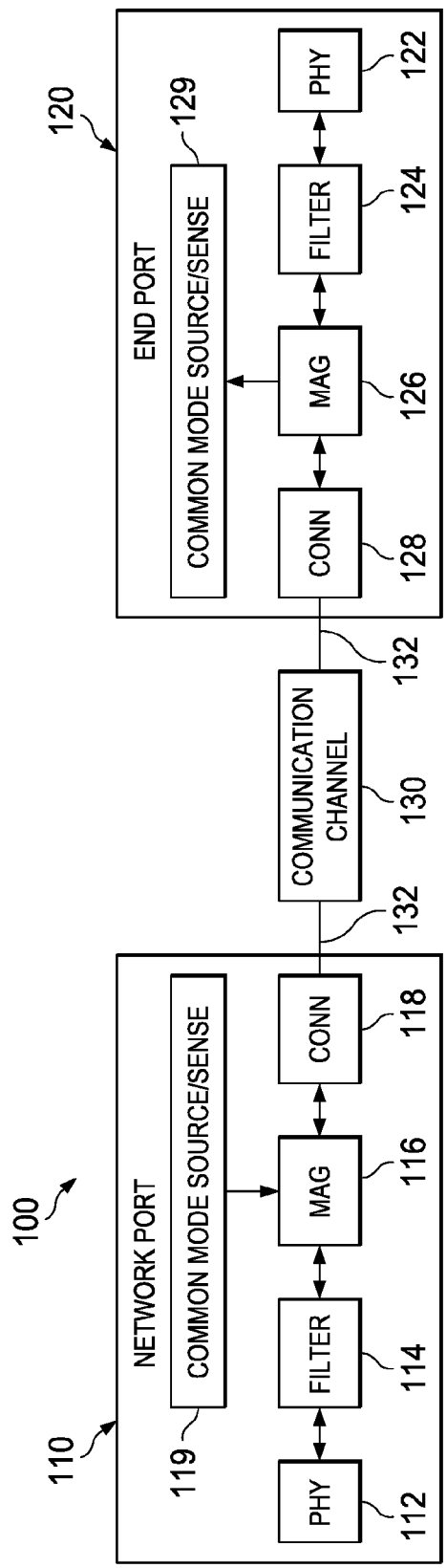
FIG. 1 is a block diagram illustrating an example system for communication channel diagnostics.
Figure 2A:
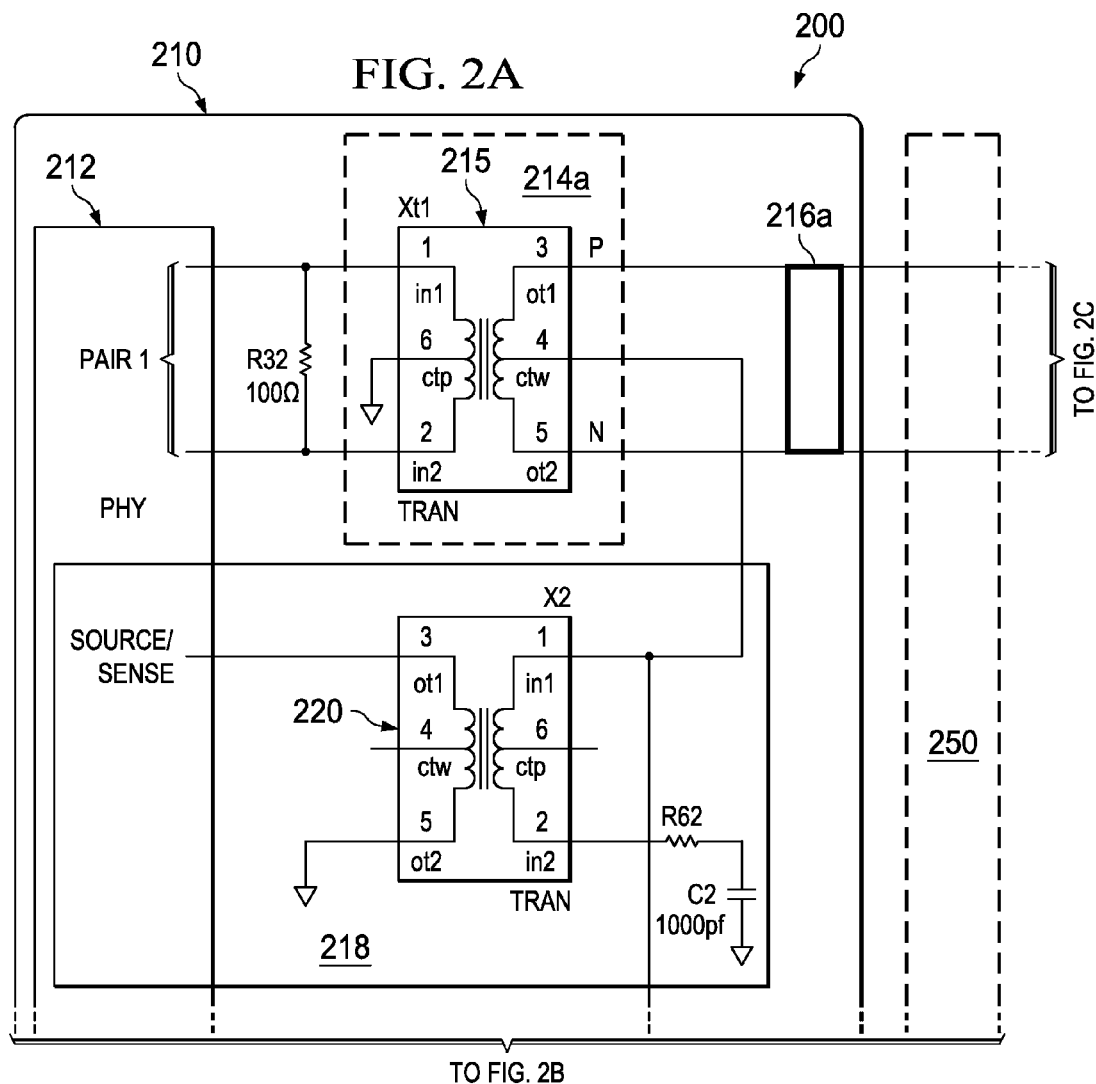
FIGS. 2A-D are schematic diagrams illustrating an example system for communication channel diagnostics.
Figure 2B:
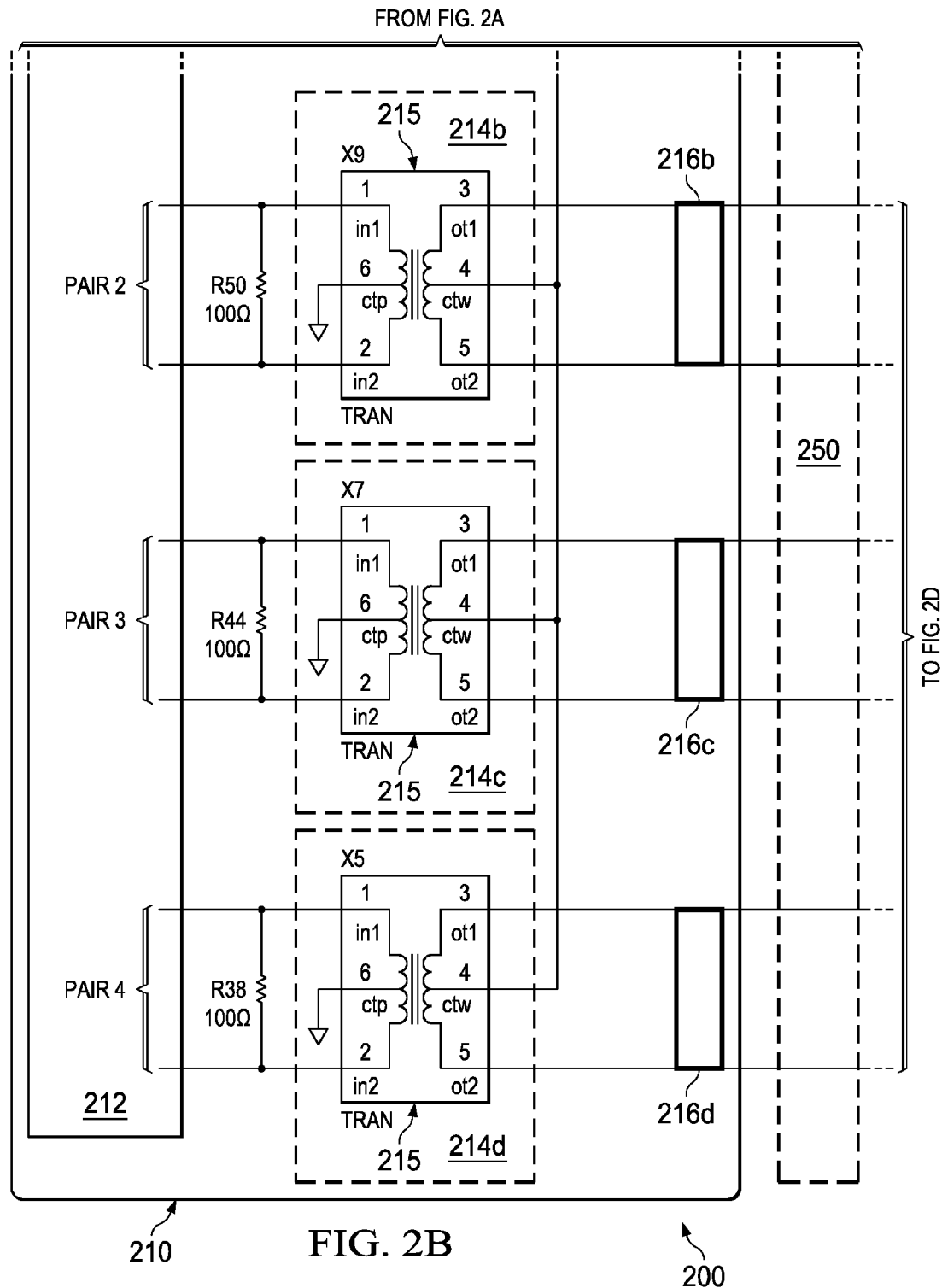
Figure 2C:
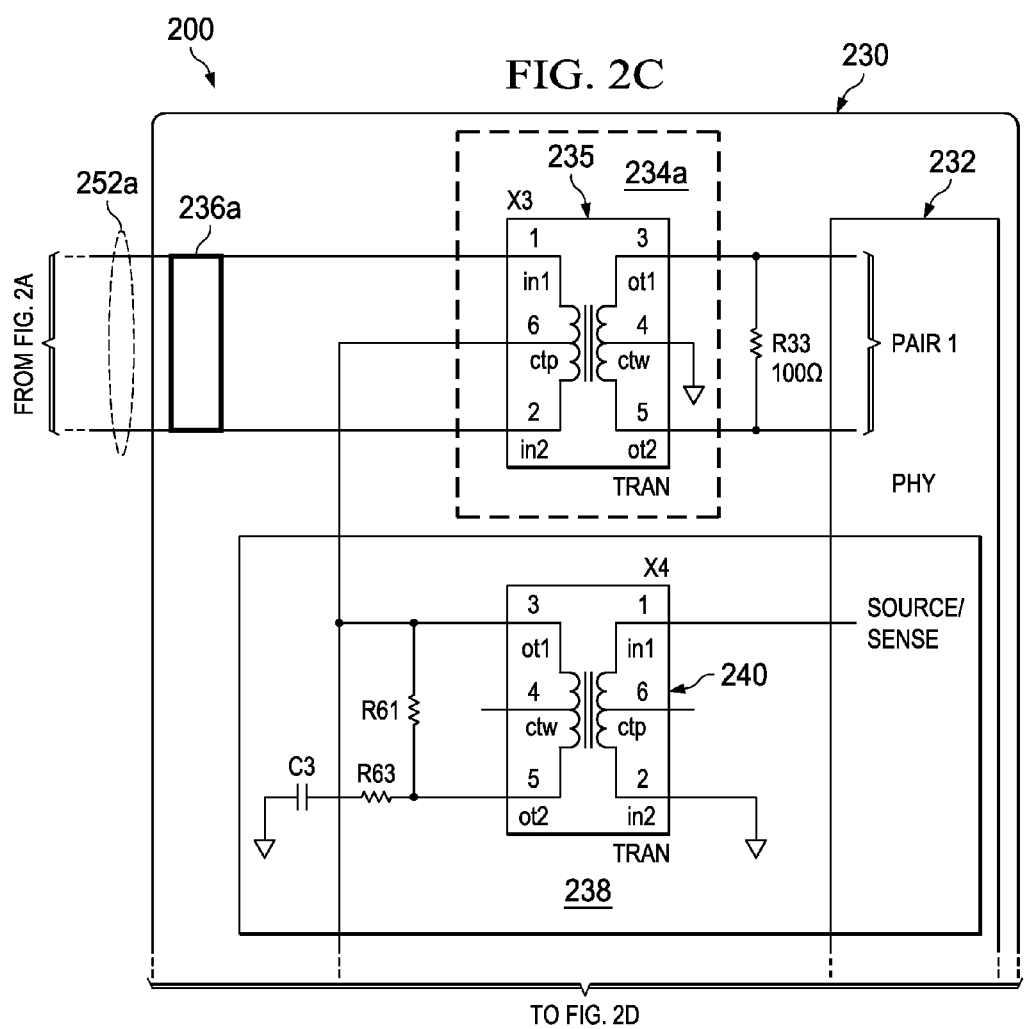
Figure 2D:
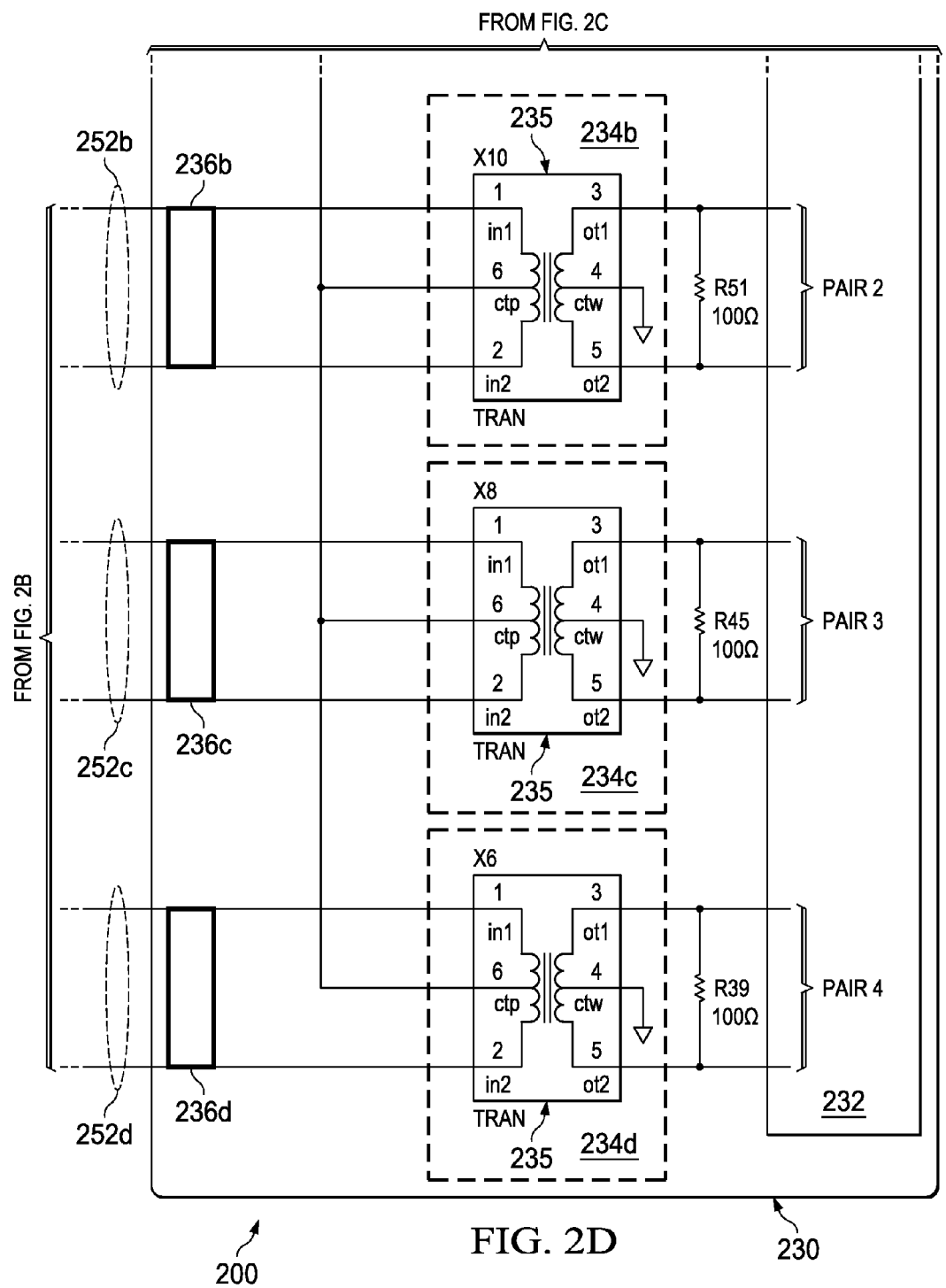
Figure 3A:
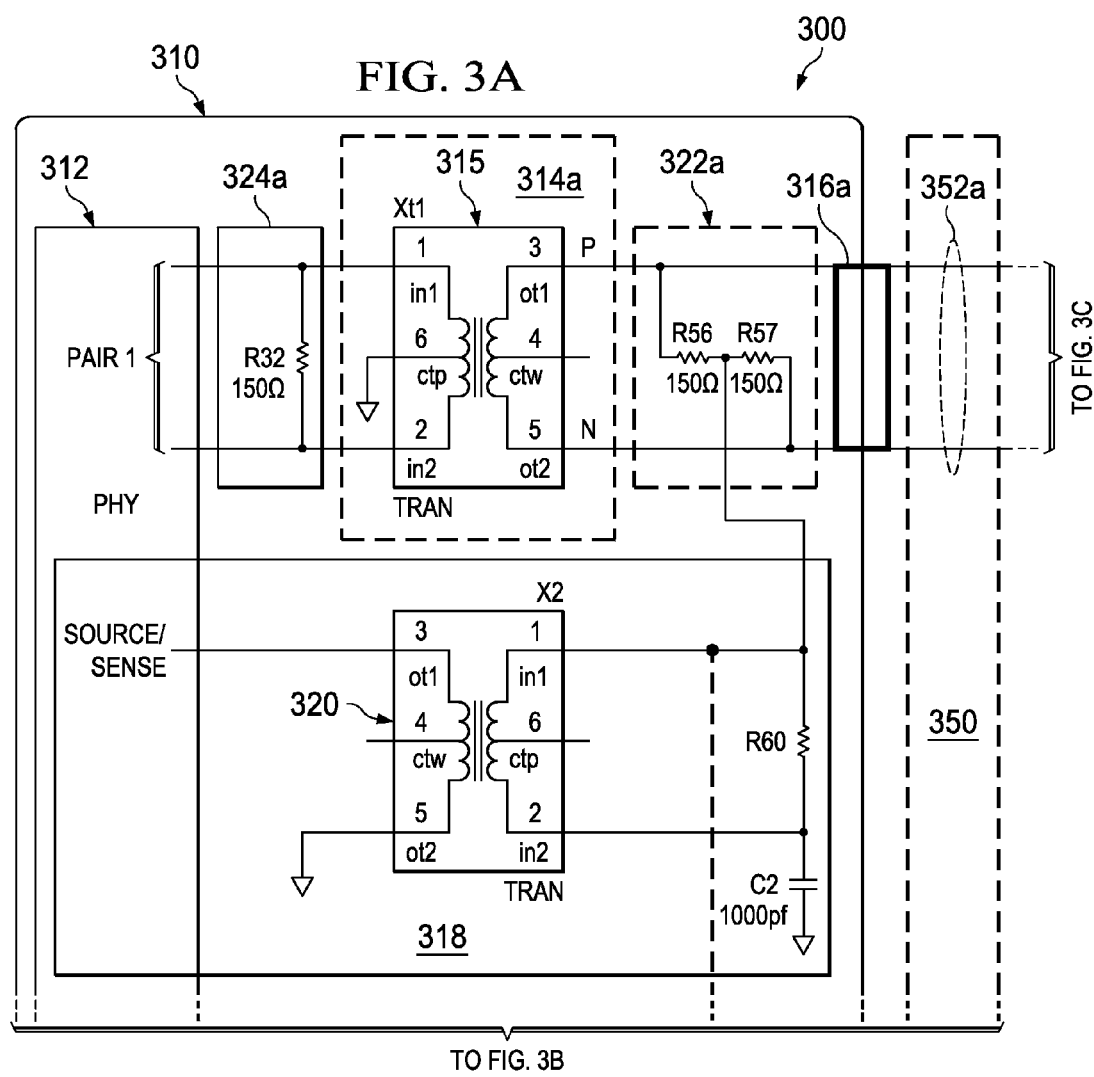
FIGS. 3A-D are schematic diagrams illustrating another example system for communication channel diagnostics.
Figure 3B:
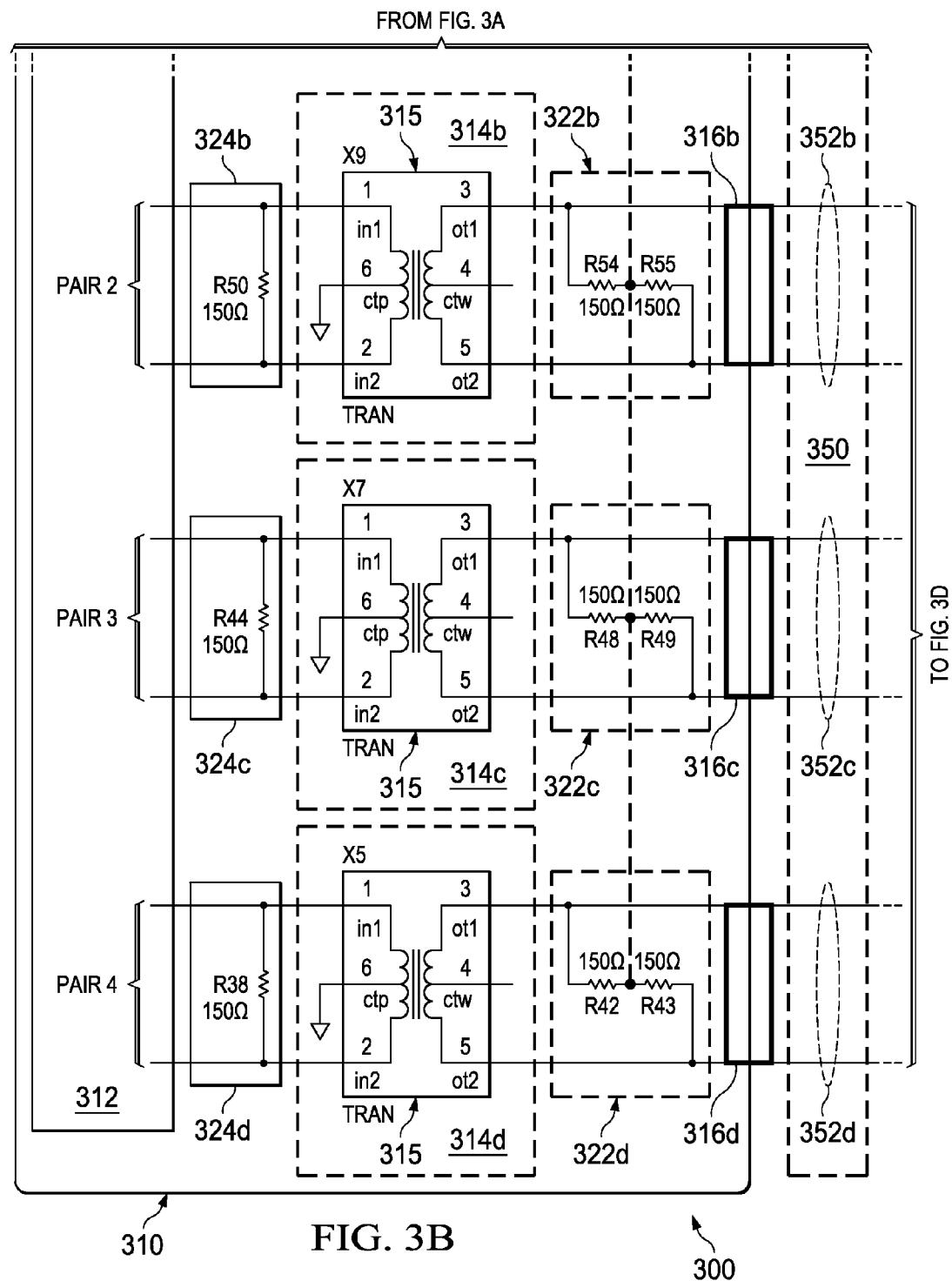
Figure 3C:
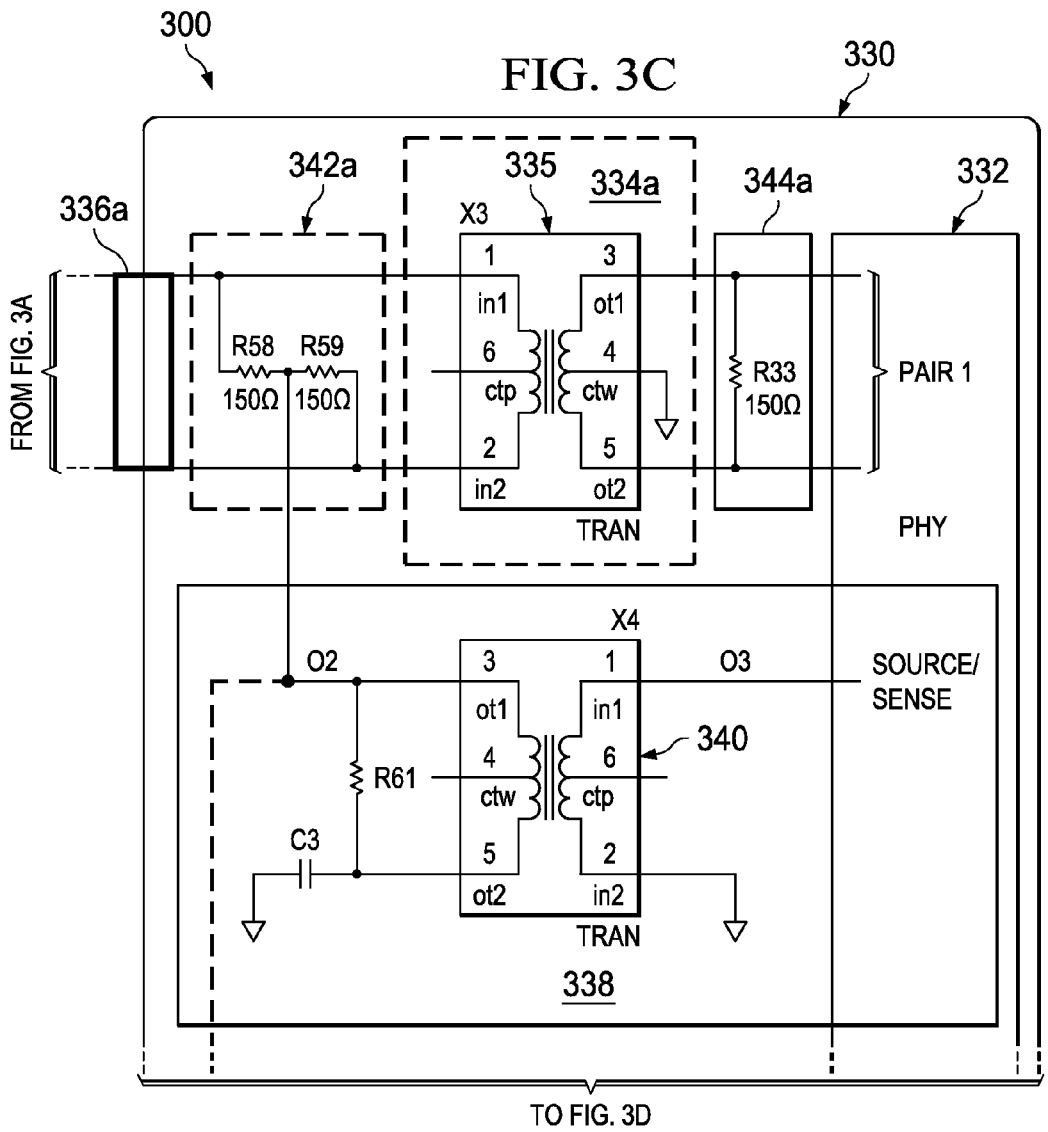
Figure 3D:
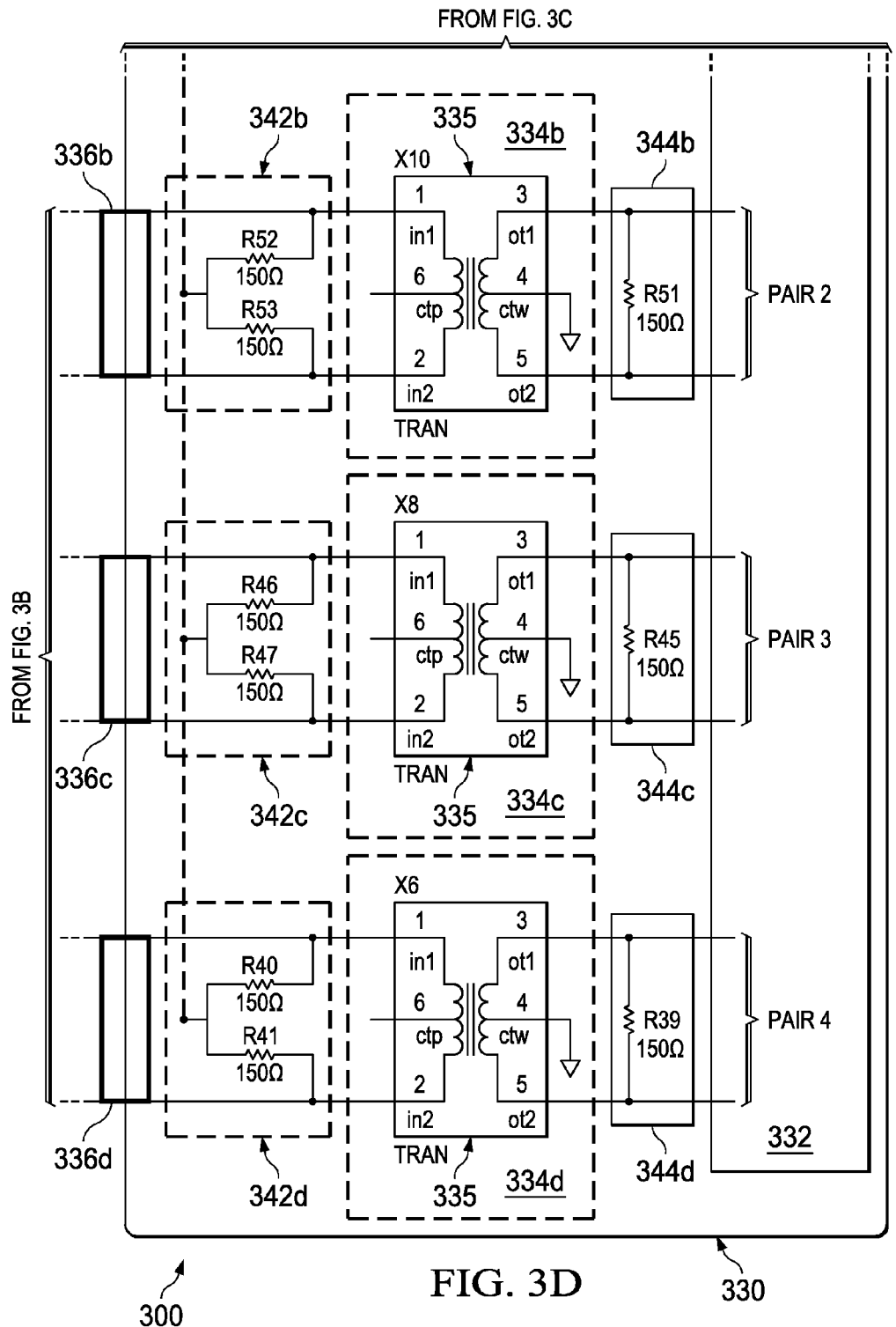

FIG. 1 illustrates an example system 100 for communication channel diagnostics in accordance with one example embodiment. System 100 includes a network port 110 coupled to an end port 120 over a communication channel 130. In this particular implementation, network port 110 includes a physical transceiver 112, a filter 114, an instance of magnetics 116, and a connector 118. Physical transceiver 112 is responsible for the hardware send and receive functions for messages (e.g., packets). As such, it may operate at the physical layer (i.e., Layer 1) of the Open Systems Interconnect (OSI) model. In certain implementations, transceiver 112 is a mixed-signal integrated circuit. Filter 114 can be configured for filtering electrical signals output by (and received for) physical transceiver 112. Filter 114 may include one or more electrical components (e.g., inductors, capacitors, and resistors).

Magnetics 116 may, among other things, be responsible for providing alternating current (AC) coupling to get rid of direct current (DC) offset, common-mode rejection, and isolation. Magnetics 116 may include one or more electrical components, (e.g., inductors, capacitors, and resistors, and transformers). Connector 118 can be configured for providing a connection for a conduit that will carry the signals. In certain implementations, magnetics 116 may be housed inside connector 118, which is commonly known as a MAGJACK. In Ethernet implementations, connector 118 may, for example, be an RJ-45 connector. In certain implementations, network port 110 may be part of a network node (e.g., a router, a switch, a gateway), which may have a number of network ports.

Similar to network port 110, end port 120 may include a physical transceiver 122, a filter 124, an instance of magnetics 126, and a connector 128. Physical transceiver 122 is responsible for the hardware send and receive functions for messages. As such, it may operate at the physical layer (i.e., Layer 1) of the OSI model. Physical transceiver 122 may be implemented as one or more chips according to techniques well known to those of skill in the art. Filter 124 can be configured for filtering electrical signals output by and received for physical transceiver 122. Filter 124 may include one or more electrical components (e.g., inductors, capacitors, and resistors). Magnetics 126 may, among other things, be responsible for providing AC coupling to get rid of DC offset, common-mode rejection, and isolation. Magnetics 126 may include one or more electrical components (e.g., inductors, capacitors, and resistors, and transformers). Connector 128 can be configured for providing a connection for a conduit that will carry the signals. In Ethernet implementations, connector 118 may be an RJ-45 connector.

In particular implementations, end port 120 may be part of an end node (e.g., a personal computer, a server, etc.) that may have just one end port. In other implementations, end port 120 may be part of a network node that has a number of end ports (e.g., a switch, a router, a gateway, etc.). Communication channel 130 communicatively couples network port 110 and end port 120. Network port 110 and end port 120 are communicatively coupled to communication channel 130 through links 132. Links 132 may, for example, be cables (e.g., Category 6 or Category 6A), whether shielded or unshielded. Communication channel 130 may also include a number of other links (e.g., cables and patch cords) and connectors (e.g., RJ-45).

In certain modes of operation, a common-mode signal can be delivered to communication channel 130 and converted to a differential-mode signal on that channel. Moreover, a cable in communication channel 130 may, for example, include a number of pairs of wires, and the channel may also include a number of connectors. For example, a Category 6 cable has four pairs of wires. Sources of coupling among cables in a single bundle can be at a poorly designed device attached to the network (e.g., lower isolation on connectors sharing the same metal walls or none (i.e., they are in proximity)), at a patch panel (e.g., due to trace coupling or connectors that are not placed optimally), or along the cable run due to the coupling of the magnetic field generated by a current traveling down the wires. Additionally, noise can be coupled to a channel that has a cable in a bundle of cables, and that noise may be converted into a differential-mode voltage on the adjacent channel (i.e., channel-to-channel (C2C) conversion coupling that leads to differential conversion and C2D on the adjacent channels).

For example, assume a cable has only a common-mode noise signal on it and that this cable is in a 6:1 configuration (six around one). The common-mode on the cable may be coupled via magnetic/parasitic capacitance effects onto the other cables in the bundle. The amount of such coupling is typically a function of cable type (Cat 6, Cat 6a, etc.), the level of common-mode voltage coupled onto a channel, cable proximity, connector(s) proximity throughout the channel, and even the end common-mode termination existing inside the system that may be faulty or simply unknown for the devices that follow the standard. The standard does not specify such a termination, though a common industry practice is to deploy a 75-Ohm resistance in series with each center tap on each data transformer that is connected via a high voltage capacitor to ground.

Typically, common-to-differential (C2D) conversion is not measured by the system or the physical transceiver in the system. Although there is a specification for some types of cables in existence, connectors, patch panels, patch cords, and the mixing of cables (Cat 6 and Cat 6a, for example, and even the connectivity of cross-vendor cables) affect the C2D conversion and the common-to-common conversion of a single channel. Separately, for a channel-to-channel conversion coupling of (C2C), herein referred to as common-mode alien near-end cross talk (CANEXT), predictions can prove challenging without some real time quantification of the expected C2D conversion. C2D conversion of the channel may be a function of the cable type, cable manufacturer, plug-connector interface, cable length, common-mode terminations inside the system, the number of connectors in the channel and their separation distance, and the frequency and amplitude of the coupled common-mode noise.

Even if a handheld tester is used to quantify the C2D and C2C at installation time, future changes, aging, dust, or even plug/replug events could prevent the assurance or the validity of such measurement done at one instance in time. Also, a field tester does not take into account the performance of the patch cord plug mating to the real data system, which may have a different performance than that of the test equipment, and of the analog front end (e.g., magnetic, connector, and layout) of the attached channel partner in converting common-mode signaling to differential. Thus, the ultimate conversion results are those done when cables are attached to the real system. Note that to mitigate certain noise problems, a channel (e.g., a linkage of cables and connectors) can be tested when it is installed. This is typically accomplished with handheld units to qualify the quality of the C2D conversion. Additionally, current physical transceivers may re-initialize their filters and adapt to the noise in order to "subtract" it out and improve immunity.

Furthermore, although there are stringent specifications for differential alien near-end cross talk (differential ANEXT) (alien near-end cross talk (ANEXT) is the near-end crosstalk from one cable onto its neighbors), resulting in the cables being inherently designed to leak very little in differential-mode, the standards have little on the common-mode generated differential, referred to herein as CANEXT. IEEE standard 802.3an calls for 70 dB isolation between cables, but in some actual cases, it is closer to 40 dB, a difference of 30 dB less in attenuation due to the C2C coupling. In any case, the isolation is typically at least ten times worse and is a function of the cable brand, the proximity in a bundle, common-mode termination at each end, patch panels, and potential noise sources from the outside that are not intrinsic to the network.

Thus, the need to more completely test a system and, further, to do so at certain times or events (e.g., periodically, upon link down or cable unplug conditions, upon link degradation/detection of errors, and/or even in a debug mode) is quite useful. One use case would be to check the quality of the link under noise conditions over the bandwidth of the technology in use on a single channel and among adjacent channels upon first installation of the hardware at the cable connectivity/bring-up time.

To address one or more of these issues, network port 110 may include a common-mode source/sense circuit 119, and end port 120 may include a common-mode source/sense circuit 129. Common-mode source/sense circuit 119 and/or common-mode source/sense circuit 129 may be used to insert common-mode signals onto one or more pairs of wires in a cable (e.g., Category 6, 6a, and shielded Category 7, 7a, etc.) of communication channel 130, and common-mode source/sense circuit 119 and/or common-mode source/sense circuit 129 may be used to sense the common-mode signal after it has traversed communication channel 130. Additionally, the circuitry of physical transceiver 112 and physical transceiver 122 used for standard messaging may be used to measure differential-mode noise generated due to the inserted common-mode signal. In particular implementations, voltages may be measured with a precision of about 1 mVolt. Detailed examples of common-mode source/sense circuit 119 and common-mode source/sense circuit 129 will be illustrated below.

In some implementations, the physical transceivers may perform differential training before performing common-mode operations. In these implementations, differential signals may be sent over communication channel 130, and the noise measured. Unacceptable frequencies may then be filtered. Differential training may also be useful for differentiating common-mode referenced noise from differential-mode noise. For example, an ambient check of static common-mode noise signals that may be present on a channel due to the environment may be done early on to calibrate such noise out and, if excessive, to instruct a user (e.g., IT manager) to find the noise source. This may prevent data transfer impairment under the presence of additional noise that may randomly couple onto a channel at a later time that cannot be predicted.

In certain modes of operations, common-mode source/sense circuit 119 and common-mode source/sense circuit 129 may be used to perform common-mode training or calibration measurements. The following is a set of rules that can be applied in sequence or standalone when needed. For example, upon a cable plug in and before communication channel 130 is determined ready for data transfer, physical transceiver 112 may perform differential data training to equalize cable loss. For instance, it may sense the presence of any differential or common-mode noise that may be present without the presence of any valid communication signaling. Additionally, common-mode training may be performed at this time in order to predict the performance of the channel under noise. This training can be performed at one end or both ends of the channel. Using both ends would help validate the interoperability of two different systems under noise conditions using a real-time channel at the installation time.

Given concerns that common-mode signals can generate Electromagnetic Interference (EMI), common-mode circuit 119 could apply the training signals as a small burst of signals in time that can hardly be detected. For instance, the signals may be a few microseconds in length. During installation, the signals may be as long as a few seconds, if needed. Additionally, these signals can be applied upon the detection of corrupted data or on demand in a debug mode under the supervision of a user (e.g., an IT professional), who is in control of the network port's software and is searching for the source of a problem.

In implementations where both sides of the channel have similar common-mode capabilities, an agreement may be reached regarding whether network port 110 or end port 120 will source common-mode signals and under what conditions. A protocol called auto-negotiation in the IEEE 802.3 standard may, for example, be used for this. In the end, one side may be a master, as defined in the 10 GBaseT differential negotiation, and that may be used to obtain an agreement regarding which side will perform the common-mode sourcing. Typically, a switch would be a master if connected to a NIC for purposes of these tests. The results can be shared with the attached link partner via standard messaging (e.g., Ethernet packets). In the case of a switch-to-switch connection, a simple exchange at the auto-negotiation stage can determine which of the two devices is the slave and which is the master (i.e., which can source common-mode signals and which cannot). If the link partner is enabled to do such testing, it can listen on its end while the test is activated by the master, and it can do its own measurements. In addition, both ends may exchange results to examine what each end is sensing (e.g., by standard messaging or using Auto-negotiation FLP signaling with the proper payload to enhance the C2D measurement results). Additionally, there may be times where both sides may need to source such signals, where they both are sensing while one is sourcing common-mode signals, but that is done in a sequence in order to avoid the collision of the generated common-mode signals.

The test results may include noise levels mapped according to frequency. A physical transceiver such as physical transceiver 112 typically has sufficient processing speed and bandwidth to reconstruct the transfer function for the C2D mode and, thus, may be responsible for compiling the test results and analyzing them. Physical transceiver 112 may, for example, use an on-board processor (e.g., a digital signal processor (DSP) or ASIC) operating according to instructions (e.g., in firmware or memory) to perform these operations. In other implementations, a processor (e.g., a microprocessor, an application specific integrated circuit (ASIC), or a field programmable gate array (FPGA)) residing in a system may have the task of handling the calculation and storage of the results for any node of the network attached to a system. The C2D transfer function may be a characteristic chart-plot of conversion of common-mode to differential power over frequency. In particular implementations, the frequency range may be between a few MHz up to 400-500 MHz (i.e., where the 10 GbaseT data spectrum is). If a channel has excessive noise at one or more frequency ranges, a notification (e.g., a message, logged data, an alert, or a signal) may be generated for a user (e.g., an IT technician, professional, administrator, or any other appropriate person). Excessive noise levels may be stored in memory (e.g., in a table or other suitable structure) on network port 110 or the associated network component.

In certain situations, before signals are sourced, the ambient noise may need to be calibrated out so it does not affect the measurements done at the physical transceiver level. The receiving circuitry of the physical transceiver that is normally used for differential data may be used for these measurements. Additionally, common-mode circuit 119 and/or common-mode circuit 129 may be used to determine if there is any common-mode noise on the channel. If the noise is determined to be excessive, or if the noise leaves the system with a much lower margin that can compromise data transfer under the presence of additional noise that may couple onto a channel at an unpredictable time, the link is kept from operating at installation time until a user (e.g., IT manager) has found the source of the noise.

Typical physical transceiver chips do not attempt such measurements. Instead, they respond to corrupted data with a notch filter in the digital domain and retrain the DSP coefficient to make the physical transceiver immune to noise. This same feature can be used for the common-mode training on a single channel and on a channel to channel basis even in the presence of data because once the immunity is present, a physical transceiver may be free to source a burst of common-mode signals to determine if a new cable being plugged in will be a potential source of noise under an interference. As the common-mode frequency is changed, the physical transceiver would understand the next target-frequency to be sourced and could apply the notch appropriately while letting go of the previous one or possibly the one before last. This aging of the notches may be needed to ensure that not too much energy is taken out of the data spectrum. At installation time, this may be less of an issue.

While a sourcing network device with multiple data ports (e.g., a data switch) may examine its memory for the potential interference it is about to generate and notch its physical transceiver accordingly, the channel partner (e.g., end port 120) may not know about the intent of the network device to do such activity, especially in the presence of data on many cables in the bundle (e.g., too many active ports at the same time). Thus, there may be a need to share such a capability with channel partners so they can plan accordingly. The training may be performed at the auto-negotiation level or during the 10 GbaseT link bring up. Thus, the channel partner may obtain the appropriate training and store the training in its own local memory to use when the demand arises (e.g., when the network device determines that it should execute such a test in the future) so that it is already aware and trained about the signatures at work. This may boost immunity to such signals in real time network operations.

To simplify things, a master-slave technique may be used. Usually, a switch would be a master if connected to a NIC for purposes of these tests. The results can be shared with the attached link partner via standard messaging (e.g., Ethernet packets). In the case of a switch-to-switch connection, a simple exchange at the auto-negotiation stage can determine which of the two devices is the slave and which is the master (i.e., which can source common-mode signals and which cannot). If the link partner is able to do such testing, it can listen on its end while the test is activated by the master, and it can do its own measurements. In addition, both ends may exchange results to be able to examine what each end is seeing.

The source signal would typically be a single dual tone. Other signals may be deployed when needed to test the immunity for ANEXT and CANEXT purposes, which will be discussed in more detail below. This source signaling is performed without regard to the C2D transfer function of the channel. When common-mode is picked up by a channel, the common-mode is converted to differential-mode according to the C2D transfer characteristics of the channel, which presents itself as a loss over frequency and is dependent on the channel itself.

System 100 can offer a variety of features, such as providing the ability to quantify the imbalance or C2D conversion of a channel and the effect on channel noise performance to a first order with the present channel partner. Moreover, the channel partner may quantify the noise using its own receivers. Thus, inferior and/or damaged network infrastructure may be detected. This ability may exist in a single channel and among different channels for cables wrapped in a bundle. The latter allows CANEXT measurements due to common-mode signaling to be performed at installation time and on demand. System 100 may have a differential noise-margin look-up table of noise tolerance over frequency stored in local memory for each port (may be common to all ports or unique to each port where it is done at manufacturing time). When the C2D transfer function is measured in real time, this look-up table serves as a reference to predict the quality of the data transfer under noise conditions.

Although FIG. 1 illustrates one implementation of a system for communication channel diagnostics, other implementations of the system may include fewer, additional, and/or a different arrangement of components. For example, a network port may not include a filter. As another example, a system may not include common-mode sourcing/sensing capability at both ends of a communication channel. In these implementations, the common-mode source may also perform the differential-mode sensing. Additionally, a network node may have a number of ports, which correspond to different communication channels, and be able to insert common-mode signals into each port.

FIG. 2 (inclusive of FIGS. 2A through 2D) illustrates an example system 200 for communication channel diagnostics. System 200 includes a first port 210, a second port 230, and a channel 250 between the ports. In this example, system 200 is configured for an Ethernet environment. First port 210 could, for example, be part of a network node (e.g., a switch or router) or an end node (e.g., a personal computer or server), and second port 230 could, for example, be part of an end node or a network node.

As illustrated, channel 250 includes four pairs of wires 252, but this is primarily for illustration purposes. In most real-world implementations, channel 250 could also include a number of connectors, patch cords, etc. First port 210 includes a physical transceiver 212, magnetics 214, and connectors 216, one for each pair of wires 252. First port 210 could also include a filter, but one is not shown for the sake of simplicity. Physical transceiver 212 is responsible for the hardware send and receive functions for messages (e.g., packets). Magnetics 214 can be configured for, among other things, providing AC coupling to get rid of DC offset, common-mode rejection, and isolation. In this implementation, each magnetic 214 includes a transformer 215. Magnetics 214 typically also include one or more common-mode chokes, but these are not shown for the sake of simplicity. Connectors 216 are responsible for providing a connection to channel 250. Connectors 216 may, for example, include an RJ-45 connector.

First port 210 also includes a common-mode source/sense circuit 218. Source/sense circuit 218 is adapted so that physical transceiver 212 has an additional channel to insert and sense common-mode signals on wires 252. As illustrated, source/sense circuit 218 includes a transformer 220 that converts signals from physical transceiver 212 into appropriate signals for wires 252 and converts signals on wires 252 into appropriate signals for physical transceiver 212. Source/sense circuit 218 may also include one or more common-mode chokes and terminations, but those are not illustrated for the sake of simplicity. Transformer 220 is wired into a center tap of transformers 215 to allow signal flow to/from each pair of wires 252. Physical transceiver 212 may source and/or sense signals to/from one or more pairs of wires at the same time. In this implementation, transformer 220 couples outgoing and incoming common-mode signals onto wires 252 via the center tap of transformers 215 at the same time. In other implementations, a single pair of wires 252 may be sourced with common-mode signals at a time. For example, a common-mode circuit may be deployed for each wire pair 252 and be coupled to a center tap of an associated transformer 215.

Using the circuitry that it uses for standard messaging (not shown for the sake of simplicity), physical transceiver 212 may sense C2D conversion on each pair 252 in response to the insertion of a common-mode signal. Additionally, as will be discussed later, this same common-mode signal may be used for an alien near-end crosstalk (ANEXT) measurement from the common-mode signaling present on one cable as it "pollutes" other cables in a bundle.

In one instance, the ANEXT could be the differential noise measured due to the C2C or the common-to-common coupling among cables that is converted on the cable being measured. If differential signals are applied, the ANEXT measurement could be the sum of both the differential crosstalk ANEXT D2D (differential to differential) and the C2D CANEXT that is the result of the common-mode coupling among cables in the bundle that is converted to differential.

Similar to first port 210, second port 230 includes a physical transceiver 232, magnetics 234, and connectors 236, one for each pair of wires 252. Physical transceiver 232 is responsible for the hardware send and receive functions for messages. Magnetics 234 are responsible for, among other things, providing AC coupling to get rid of DC offset, common-mode rejection, and isolation. Each magnetic 234 includes a transformer 235. Magnetics 234 also typically include one or more common-mode chokes, but those have not been illustrated for the sake of simplicity. Connectors 236 are responsible for providing a connection to channel 250. Connectors 236 may, for example, include an RJ-45 connector.

Second port 230 also includes a common-mode source/sense circuit 238. Source/sense circuit 238 is adapted so that physical transceiver 232 has an extra channel to insert and detect common-mode signals on wires 252. As illustrated, source/sense circuit 238 includes a transformer 240 that converts signals from physical transceiver 232 into appropriate signals for wires 252 and coverts signals on wires 252 into appropriate signals for physical transceiver 232. Transformer 240 is wired into a center tap of transformers 235 to allow signal flow to/from each pair of wires 252. Physical transceiver 232 may source and/or sense signals to one or more pairs of wires at the same time.

Using the circuitry that it uses for standard messaging (not shown for the sake of simplicity), physical transceiver 232 may sense C2D conversion on each pair. Thus, physical transceiver 232 may calculate the C2D conversion on each pair. Additionally, as will be discussed later, this same common-mode signal may be for an alien near-end crosstalk (ANEXT) measurement from the common-mode signaling present on one cable as it "pollutes" other cables in a bundle. In some instances, ANEXT could be the differential noise measured due to the C2C or the common-to-common coupling among cables that is converted on the cable being measured. If differential signals are applied, the ANEXT measurement would be the sum of both the differential crosstalk ANEXT D2D (differential to differential) and the C2D CANEXT that is the result of the common-mode coupling among cables in the bundle that is converted to differential.

FIG. 3 (inclusive of FIGS. 3A-3D) illustrates an example system 300 for communication channel diagnostics. System 300 includes a first port 310, a second port 330, and a communication channel 350 between the ports. As illustrated, system 300 is configured for an Ethernet environment. First port 310 could, for example, be part of a network node (e.g., a switch or router) or an end node (e.g., a personal computer or server), and second port 330 could, for example, be part of a network node or an end node.

In this example, channel 350 includes four pairs of wires 352. In most real-world implementations, channel 350 could also include a number of connectors, patch cords, etc. First port 310 includes a physical transceiver 312, magnetics 314, and connectors 316, one for each pair of wires 352. First port 310 could also include a filter, but one is not shown for the sake of simplicity. Physical transceiver 312 is responsible for the hardware send and receive functions for messages. Magnetics 314 are responsible for, among other things, providing AC coupling to get rid of DC offset, common-mode rejection, and isolation. In this implementation, each magnetic 314 includes a transformer 315. Magnetics 314 typically also include one or more common-mode chokes, but these are not shown for the sake of simplicity. Connectors 316 are responsible for providing a connection to channel 350.

First port 310 also includes a common-mode source/sense circuit 318. Source/sense circuit 318 is adapted so that physical transceiver 312 can insert and detect common-mode signals on wires 352. As illustrated, source/sense circuit 318 includes a transformer 320 that converts signals from physical transceiver 310 into appropriate signals for wires 352 and coverts signals on wires 352 into appropriate signals for physical transceiver 312. Transformer 320 is wired into a termination 322 for each pair of wires 352 to allow signal flow to/from each pair of wires 352. In the illustrated implementation, each termination 322 is valued at 300 ohms differential. Physical transceiver 312 may source and/or sense signals to/from one or more pairs of wires 352 at the same time. In this implementation, transformer 320 couples outgoing and incoming common-mode signals onto wires 352 via terminations 322 at the same time. In other implementations, a single pair of wires 352 may be sourced with common-mode signals one at a time. For example, a common-mode circuit may be deployed for each pair of wires 352 and be coupled to an associated termination 322.

Terminations 324 have been adjusted in light of terminations 322. In particular, terminations 324 have been changed from 50 ohms to 75 ohms each on the physical transceiver side to keep the impedance of the system equal to that of the twisted pair cable (i.e., 100 ohms). Using the circuitry that it uses for standard messaging (not shown for the sake of simplicity), physical transceiver 312 may sense C2D conversion on each wire pair 352. Thus, physical transceiver 312 may calculate the C2D conversion on each wire pair. Additionally, as will be discussed later, this same common-mode signal may be used for an alien near-end crosstalk (ANEXT) measurement from the common-mode signaling present on one cable as it "pollutes" other cables in a bundle.

Similar to first port 310, second port 330 includes a physical transceiver 332, magnetics 334, and connectors 336, one for each pair of wires 352. Physical transceiver 332 is responsible for the hardware send and receive functions for messages. Magnetics 334 are responsible for, among other things, providing AC coupling to get rid of DC offset, common-mode rejection, and isolation. Each magnetic 334 includes a transformer 335. Magnetics 334 typically also include one or more common-mode chokes, but these are not shown for the sake of simplicity. Connectors 336 are responsible for providing a connection to channel 350.

Second port 330 also includes a common-mode source/ sense circuit 338. Source/sense circuit 338 is adapted so that physical transceiver 332 can insert and monitor common-mode signals on wires 352. As illustrated, sensing circuit 338 includes a transformer 340 that converts signals from physical transceiver 332 into appropriate signals for wires 352 and converts signals on wires 352 into appropriate signals for physical transceiver 332. Transformer 340 is wired into a termination 342 on the wire side for each pair of wires 352 to allow signal flow to each pair of wires 352. In the illustrated implementation, each termination 342 is valued at 300 ohms differential. Physical transceiver 332 may source and/or sense signals to/from one or more pairs of wires at the same time. Terminations 344 have also been adjusted in light of terminations 342. In particular, terminations 344 have been changed from 50 ohms to 75 ohms each on the physical transceiver side to keep the impedance of the system equal to that of the twisted pair cable (i.e., 100 ohms).

Using the circuitry that it uses for standard messaging (not shown for the sake of simplicity), physical transceiver 332 may sense C2D conversion on each pair of wires 352. Thus, physical transceiver 332 may calculate the C2D conversion on each pair. Additionally, as will be discussed later, this same common-mode signal may be used for an alien near-end crosstalk (ANEXT) measurement from the common-mode signaling present on one cable as it "pollutes" other cables in a bundle.

System 300 provides an alternate technique to system 200 for the insertion and sensing of common-mode signals and has certain features. For example, using the terminations provides higher bandwidth for the common-mode signal. Additionally, system 300 allows the center tap of transformers 315 to be available for other purposes, such as, for example, delivering power over Ethernet (POE), and for the center taps of transformers 335 to receive POE, or vice versa.

Figure 4A:
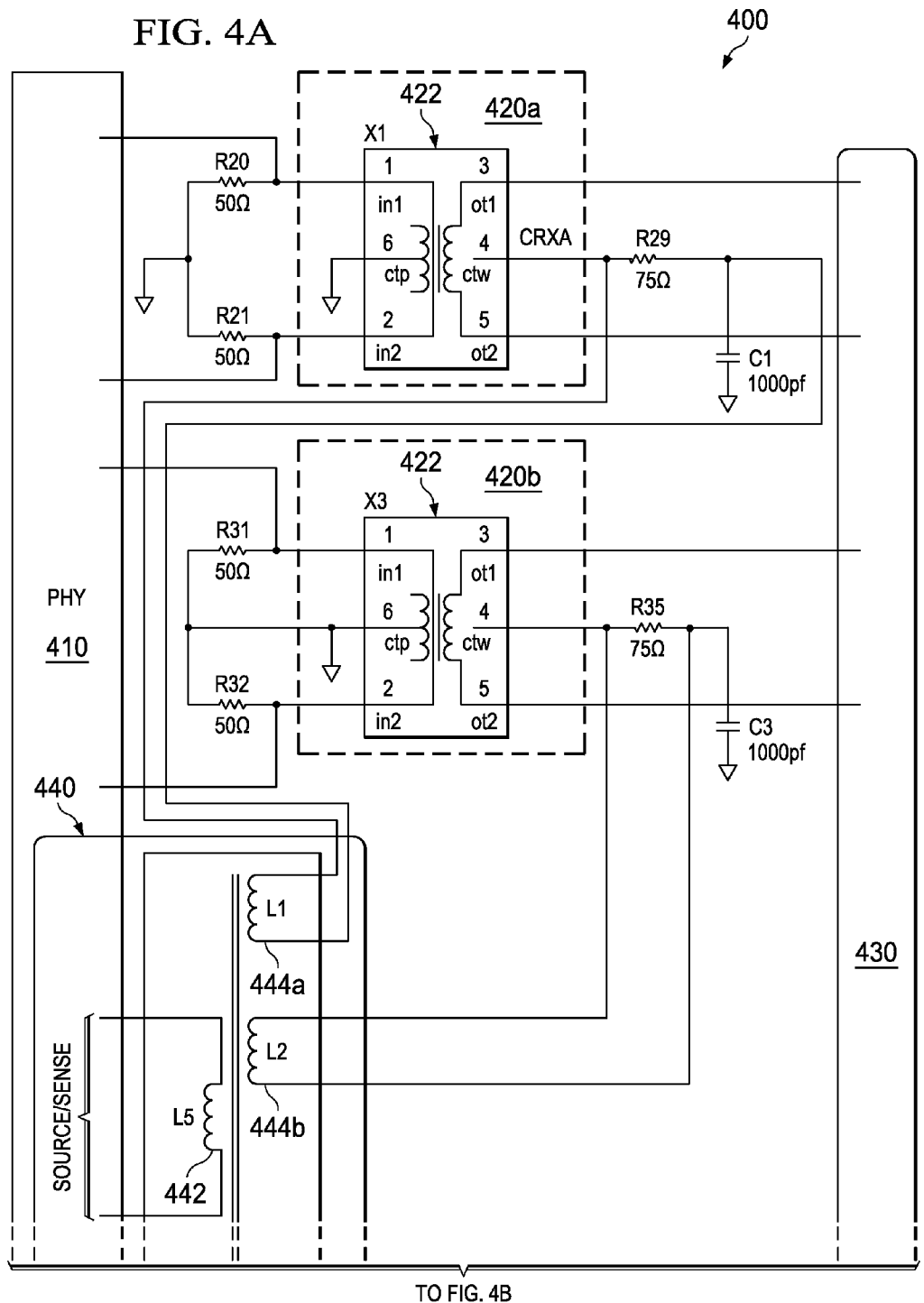
FIGS. 4A-B are schematic diagrams illustrating another example system for communication channel diagnostics.
Figure 4B:
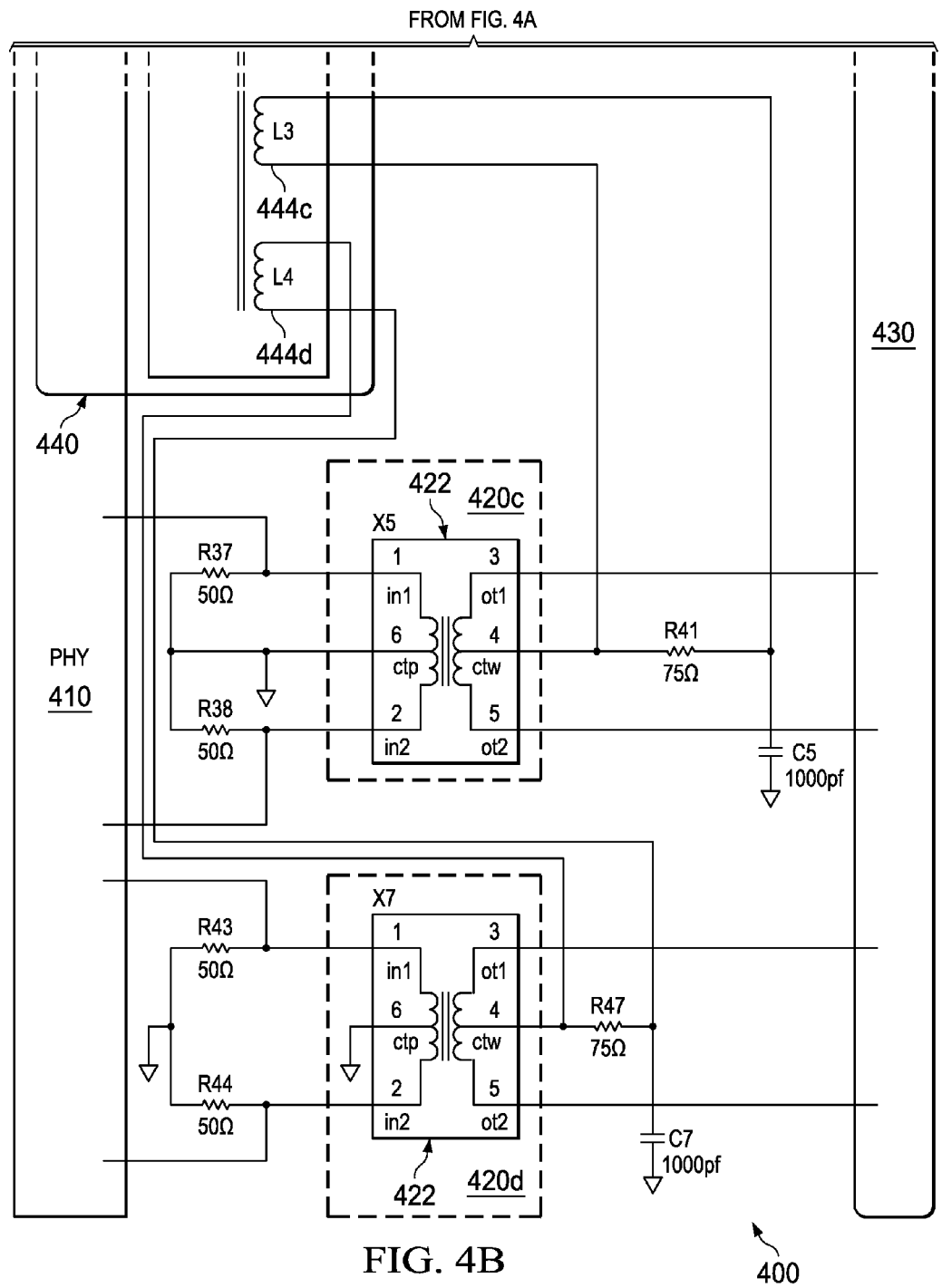

FIG. 4 (inclusive of FIGS. 4A and 4B) illustrates an example system 400 for communication channel diagnostics. System 400 provides an alternate technique to system 200 for the delivery and sensing of common-mode signals. In this illustration, system 400 is a port in an Ethernet environment. In this example, system 400 communicates over a channel that includes four pairs of wires. System 400 could, for example, be part of a network node (e.g., a switch or router) or an end node (e.g., a personal computer or server). Additionally, system 400 could be in communication with a similar system over a channel.

System 400 includes a physical transceiver 410, magnetics 420, and connectors 430, one for each pair of wires. System 400 could also include a filter, but one is not shown for the sake of simplicity. Physical transceiver 410 is responsible for the hardware send and receive functions for messages. Magnetics 420 are responsible for, among other things, providing AC coupling to get rid of DC offset, common-mode rejection, and isolation. 420 can each include a transformer 422. Connector 430 can be configured for providing a connection to a channel. Connector 430 may, for example, include an RJ-45 connector.

System 400 also includes a common-mode source/sense circuit 440. Source/sense circuit 440 is adapted so that physical transceiver 410 can insert and detect common-mode signals on communication channel wires. As illustrated, source/ sense circuit 440 includes a shared winding 442 on its primary, allowing physical transceiver 410 to drive four pairs of wires equally from a single source. Source/sense circuit 440 also typically includes one or more common-mode chokes and terminations attached to shared winding 442, but those have not been illustrated for the sake of simplicity. Source/sense circuit 440 also includes individual windings 444 on its secondary, one for each wire pair. Each individual winding 444 is coupled to a center tap of transformers 422 to allow signal flow to/from the wire pairs.

Using the circuitry that it uses for standard messaging (not shown for the sake of simplicity), physical transceiver 410 may sense C2D conversion on each wire pair. Thus, physical transceiver 410 may calculate the C2D conversion on each pair. Additionally, as will be discussed later, this same common-mode signal may be used for an alien near-end crosstalk (ANEXT) measurement from the common-mode signaling present on one cable as it "pollutes" other cables in a bundle.

Figure 5A:
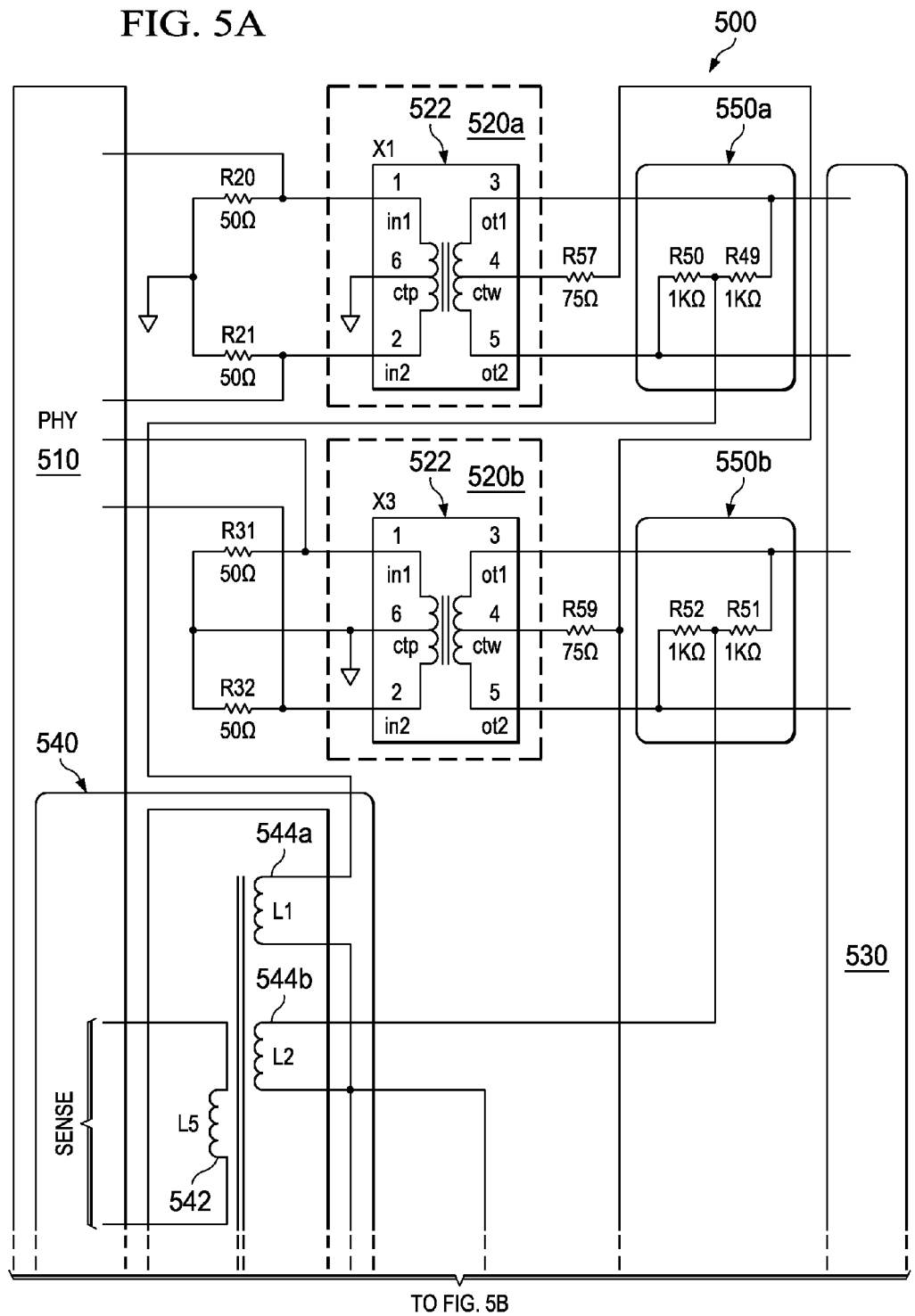
FIGS. 5A-B are schematic diagrams illustrating another example system for communication channel diagnostics.
Figure 5B:
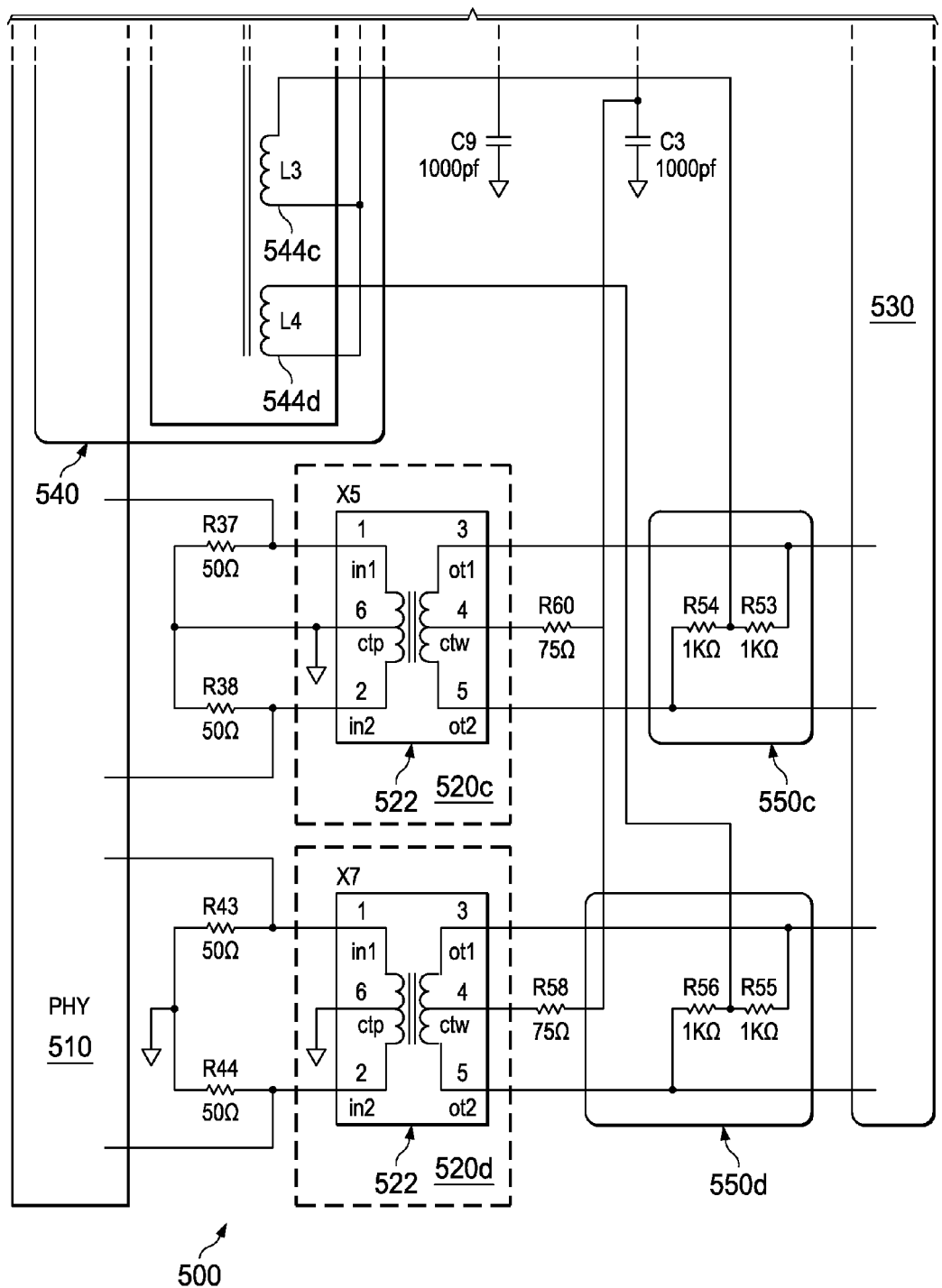

FIG. 5 (inclusive of FIGS. 5A and 5B) illustrates an example system 500 for communication channel diagnostics. System 500 provides an alternate technique to system 200 for the delivery deliver and sensing of common-mode signals. In this illustration, system 500 is a port in an Ethernet environment. In this example, system 500 communicates over a channel that includes four pairs of wires. System 500 could, for example, be part of a network node (e.g., a switch or router) or an end node (e.g., a personal computer or server). Additionally, system 500 could be in communication with a similar system over a channel.

System 500 includes a physical transceiver 510, magnetics 520, and a connector 530. System 500 could also include a filter, but one is not shown for the sake of simplicity. Physical transceiver 510 is responsible for the hardware send and receive functions for messages. Magnetics 520 are be responsible for, among other things, providing AC coupling to get rid of DC offset, common-mode rejection, and isolation. Connector 530 can be configured for providing a connection to a channel. Connector 530 may, for example, include an RJ-45 connector.

System 500 also includes a common-mode source sense circuit 540. Source/sensing circuit 540 is adapted so that physical transceiver 510 can insert and detect common-mode signals on communication channel wires. As illustrated, source/sense circuit 540 includes a shared winding 542 on its primary, allowing physical transceiver 510 to drive four pairs of wires equally from a single source. Source/sensing circuit 540 also includes individual windings 544 on its secondary, one for each wire pair. Each winding 544 is coupled to a termination 550 for each pair of wires to allow signal flow to/from each pair of wires. In this implementation, each termination 544 includes two 1K Ohm resistors. In certain implementations, system 500 may also include 2 1KV caps. These may provide isolation and an AC ground reference.

Using the circuitry that it uses for standard messaging (not shown for the sake of simplicity), physical transceiver 510 may sense C2D conversion on each wire pair. Thus, physical transceiver 510 may calculate the C2D conversion on each pair. Additionally, as will be discussed later, the common-mode energy may be used for alien near-end crosstalk (ANEXT) and CANEXT measurements from the common-mode signaling present on one cable as it "pollutes" other cables in a bundle. System 500 is similar to system 400 except that it provides minimal intrusion to the link. Additionally, system 500 allows the center tap of transformers 522 to be used for other purposes (e.g., POE).

Figure 6B:
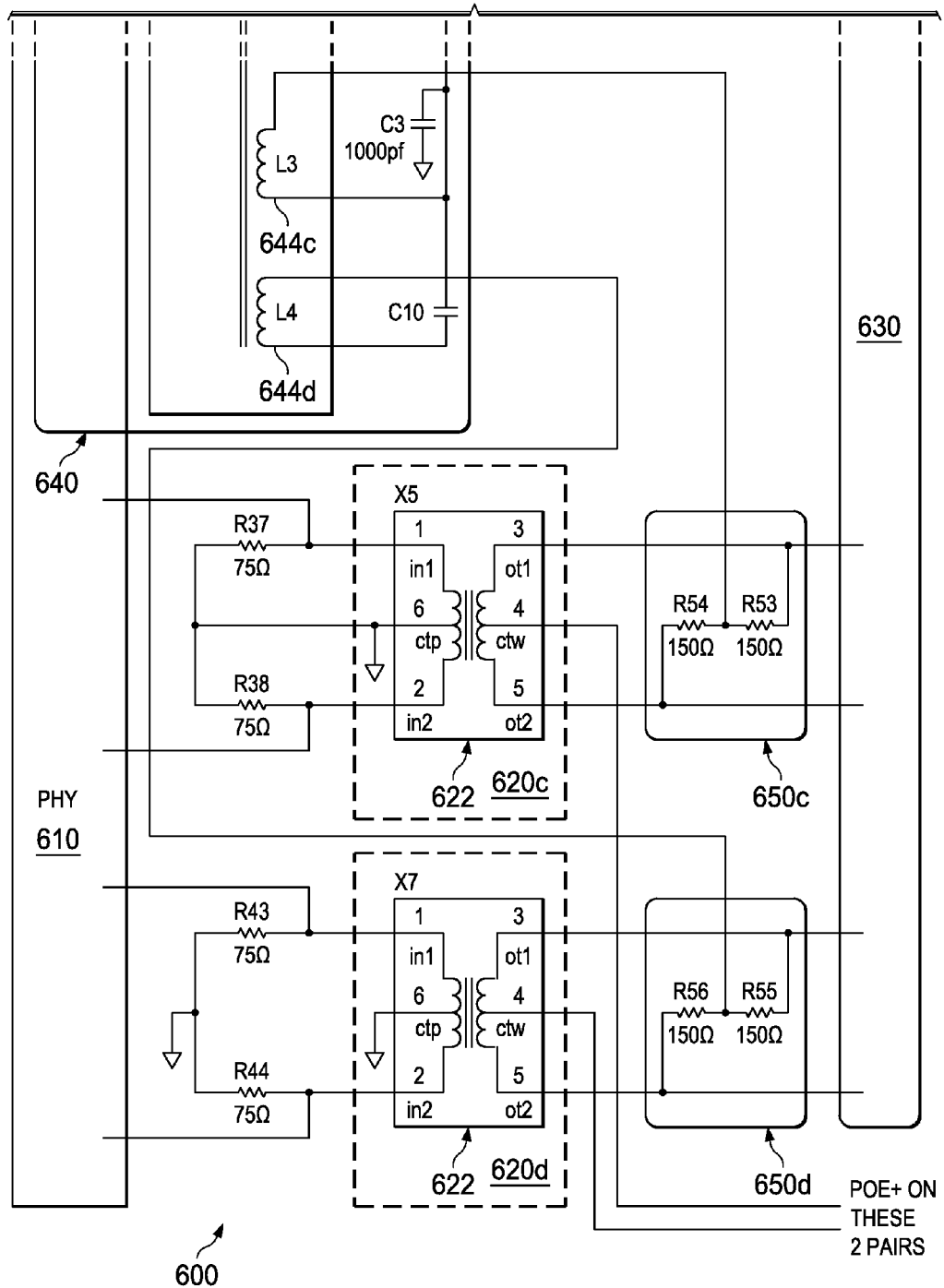

FIG. 6 (inclusive of FIGS. 6A and 6B) illustrates an example system 600 for communication channel diagnostics. System 600 provides an alternate technique to system 200 for the delivery and sensing of common-mode signals. In this illustration, system 600 is a port in an Ethernet environment. In this example, system 600 communicates over a channel that includes four pairs of wires. System 600 could, for example, be part of a network node (e.g., a switch or router) or an end node (e.g., a personal computer or server). Additionally, system 600 could be in communication with a similar system over a channel.

System 600, which is a variation of system 500, includes a physical transceiver 610, magnetics 620, and a connector 630. Physical transceiver 610 is responsible for the hardware send and receive functions for messages. Magnetics 620 may be responsible for, among other things, providing AC coupling to get rid of DC offset, common-mode rejection, and isolation. Connector 630 can be configured for providing a connection to a channel. Connector 630 may, for example, include an RJ-45 connector.

System 600 also includes a common-mode source-sense circuit 640. Source/sense circuit 640 is adapted so that physical transceiver 610 can insert and detect common-mode signals on communication channel wires. As illustrated, source/sense circuit 640 includes a shared winding 642 on its primary, allowing physical transceiver 610 to drive four pairs of wires equally from a single source. Source/sense circuit 640 also typically includes one or more common-mode chokes and terminations attached to shared winding 612, but those have not been illustrated for the sake of simplicity. Source/sense circuit 640 also includes individual windings 644 on its secondary, one for each wire pair. Each winding 644 is coupled to a termination 650 for each pair of wires to allow signal flow to/from each pair of wires. In this implementation, each termination 650 includes two 150-Ohm resistors. These smaller resistive values reduce the filtering effect due to capacitance on the center tap of transformers 622 and increase the bandwidth of the common-mode channel while allowing a path to deliver POE power through the center taps of the transformers as shown.

Using the circuitry that it uses for standard messaging (not shown for the sake of simplicity), physical transceiver 610 may sense C2D conversion on each wire pair. Thus, physical transceiver 610 may calculate the C2D conversion on each pair. Additionally, as will be discussed later, this same common-mode energy may be used for alien near-end crosstalk (ANEXT) and CANEXT measurements from the common-mode signaling present on one cable as it "pollutes" other cables in a bundle.

Figure 7A:
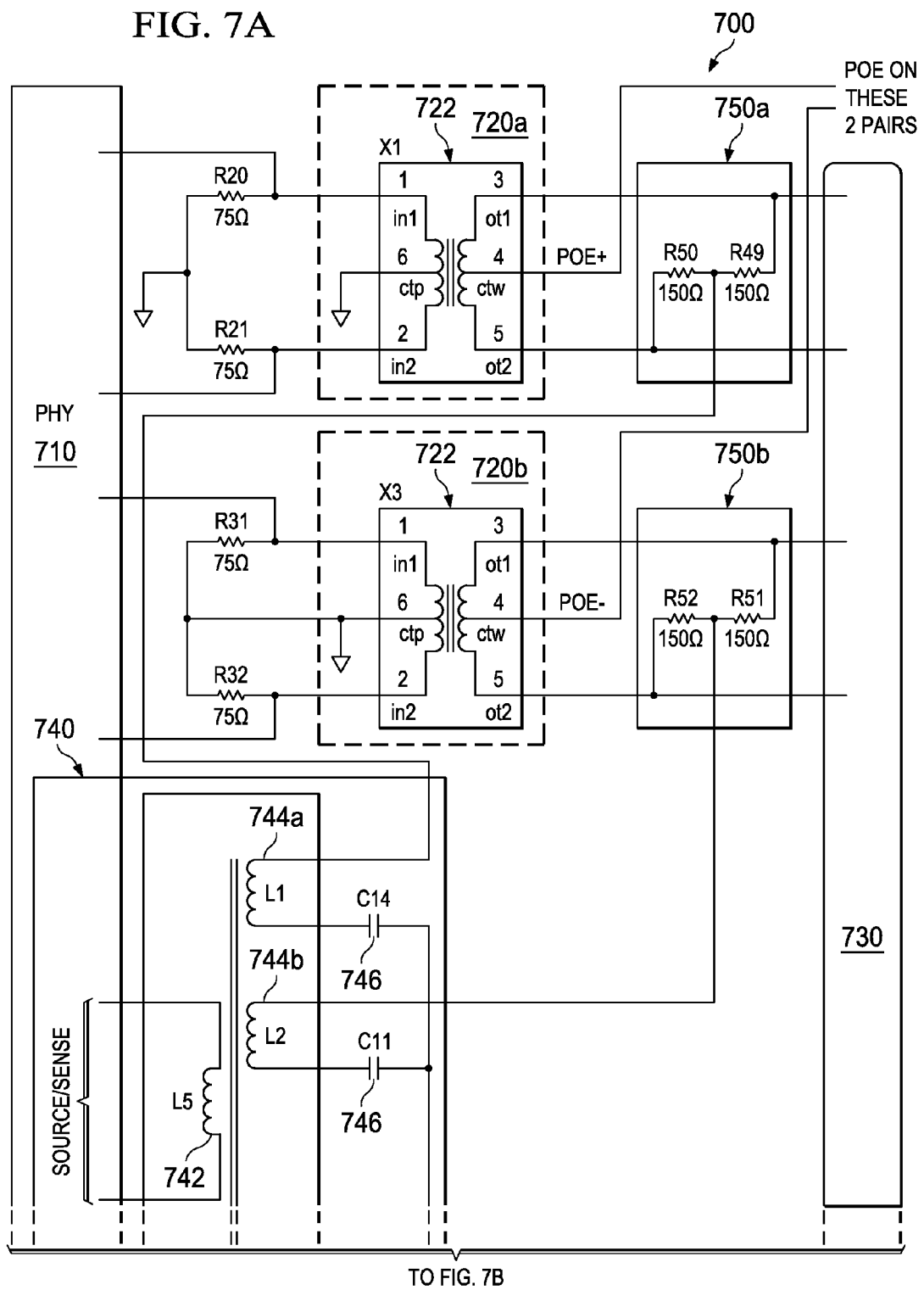
FIGS. 7A-B are schematic diagrams illustrating another example system for communication channel diagnostics.
Figure 7B:
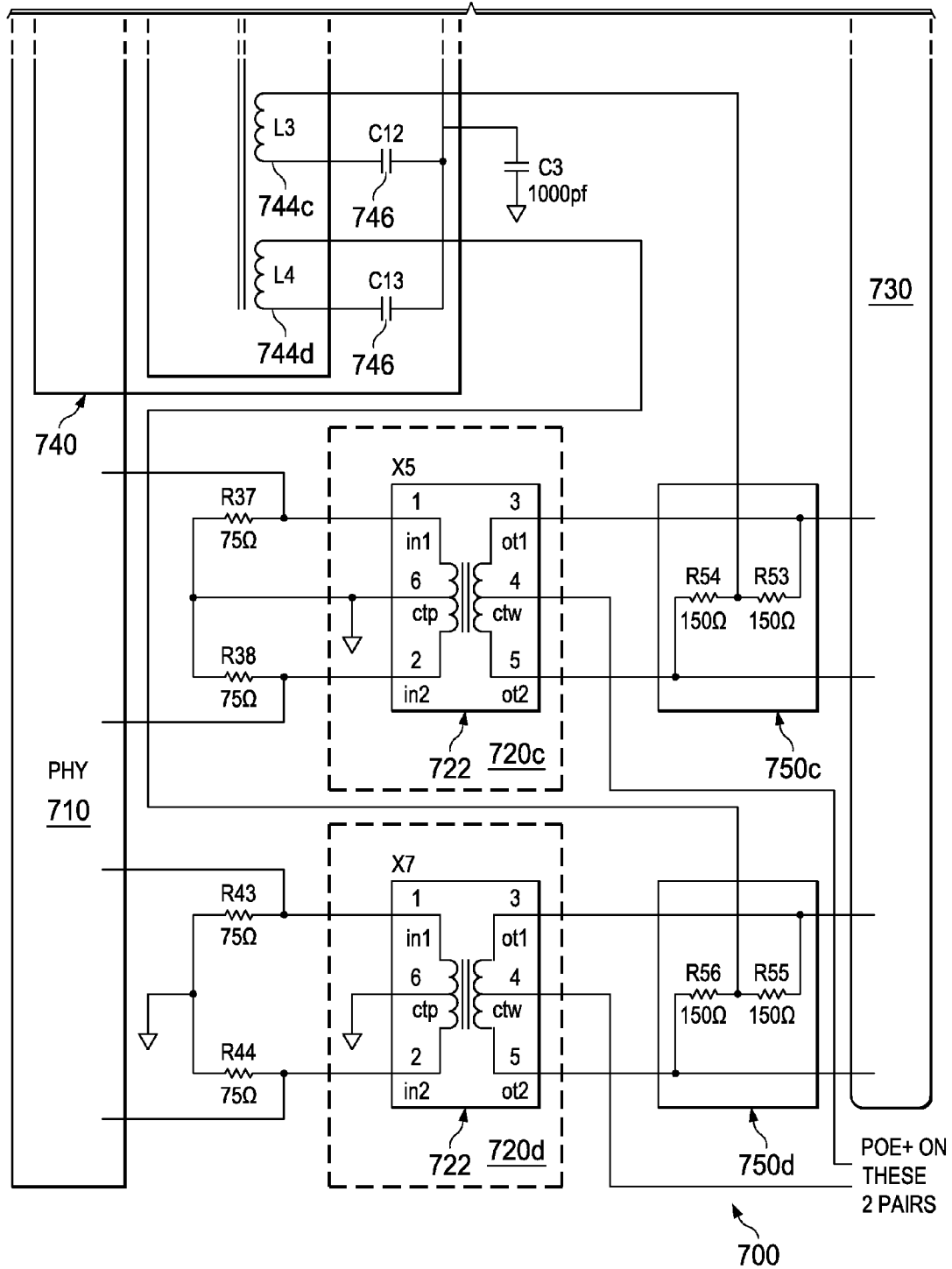

FIG. 7 (inclusive of FIGS. 7A and 7B) illustrates an example system 700 for communication channel diagnostics. System 700 provides an alternate technique to system 200 for the delivery and sensing of common-mode signals. In this illustration, system 700 is a port in an Ethernet environment. In this example, system 700 communicates over a channel that includes four pairs of wires. System 700 could, for example, be part of a network node (e.g., a switch or router) or an end node (e.g., a personal computer or server). Additionally, system 700 could be in communication with a similar system over a channel.

System 700 includes a physical transceiver 710, magnetics 720, and connectors 730, one for each pair of wires. Physical transceiver 710 is responsible for the hardware send and receive functions for messages. Magnetics 720 are responsible for, among other things, providing AC coupling to get rid of DC offset, common-mode rejection, and isolation. Connector 730 can be configured for providing a connection to a channel. Connector 730 may, for example, include an RJ-45 connector.

System 700 also includes a common-mode source/sense circuit 740. Source/sense circuit 740 is adapted so that physical transceiver 710 can insert and detect common-mode signals on communication channel wires. As illustrated, source/sense circuit 740 includes a shared winding 742 on its primary, allowing physical transceiver 710 to drive four pairs of wires equally from a single source. Source/sense circuit 740 also includes individual windings 744 on its secondary, one for each wire pair. Each individual winding 744 is coupled to a termination 750 for each pair of wires to allow signal flow to/from each pair of wires. In this implementation, each termination 750 includes two 150-ohm resistors. These smaller resistive values reduce the filtering effect due to capacitance on the center tap and increase the bandwidth of the common-mode channel while allowing a path to deliver POE power through the center taps of transformers 722 as shown. Additionally, direct current (DC) blocking capacitors 746 are used in-line with each individual winding 744 to allow POE power to flow uninterrupted, yet preserve the source/sense architecture. Moreover, blocking capacitors 746 may avert shorting out the power supply. In addition, common-mode chokes would typically be inside the magnetic components (e.g., data and common-mode source/sense magnetics), but are left out for simplicity. Moreover, additional common-mode terminations may be used.

Using the circuitry that it uses for standard messaging (not shown for the sake of simplicity), physical transceiver 710 may sense C2D conversion on each wire pair. Thus, physical transceiver 710 may calculate the C2D conversion on each pair. Additionally, as will be discussed later, this same common-mode energy may be used later to enable alien near-end crosstalk (ANEXT) and CANEXT measurements from the common-mode signaling present on one cable as it "pollutes" other cables in a bundle.

Figure 8A:
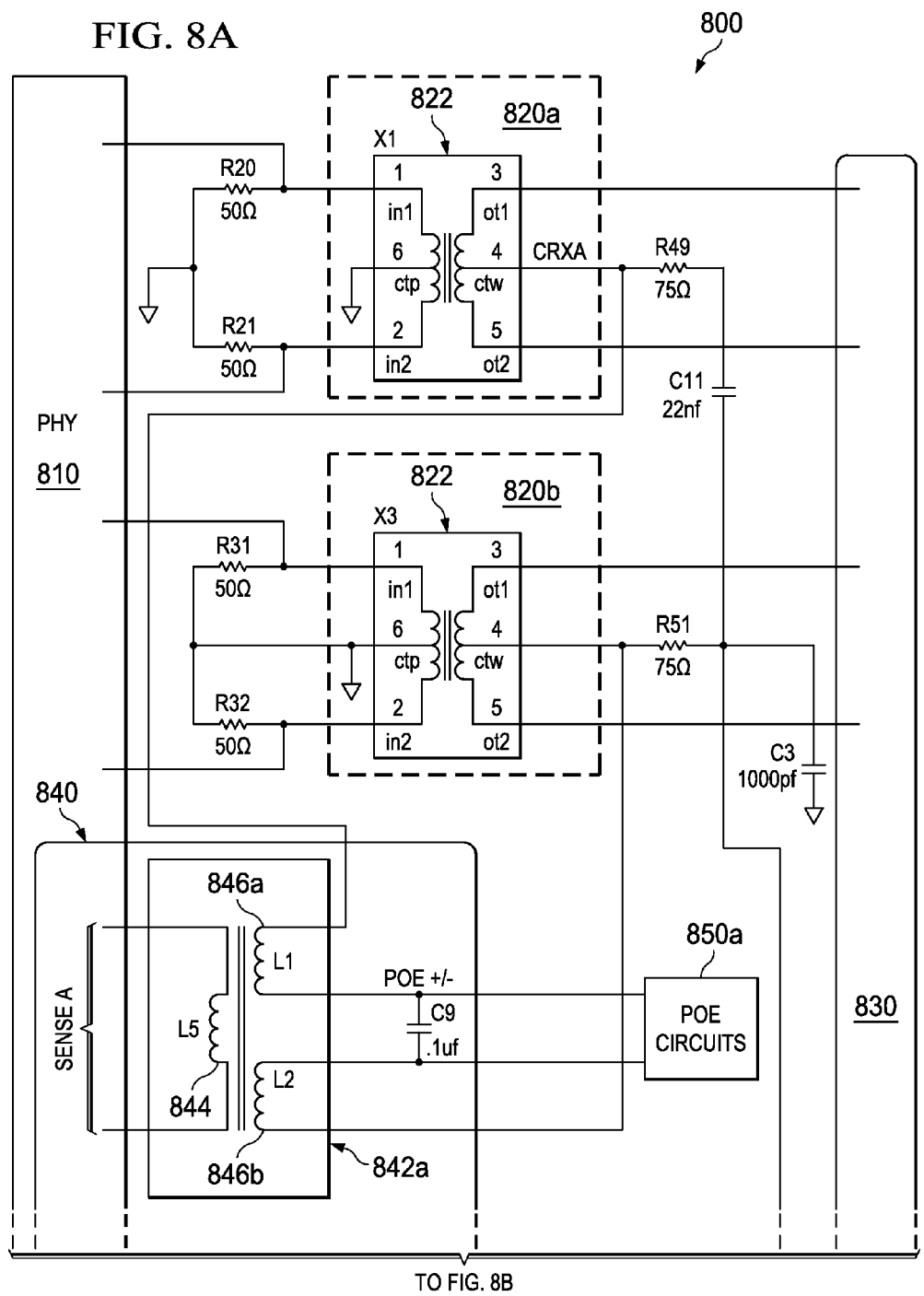
FIGS. 8A-B are schematic diagrams illustrating another example system for communication channel diagnostics.
Figure 8B:
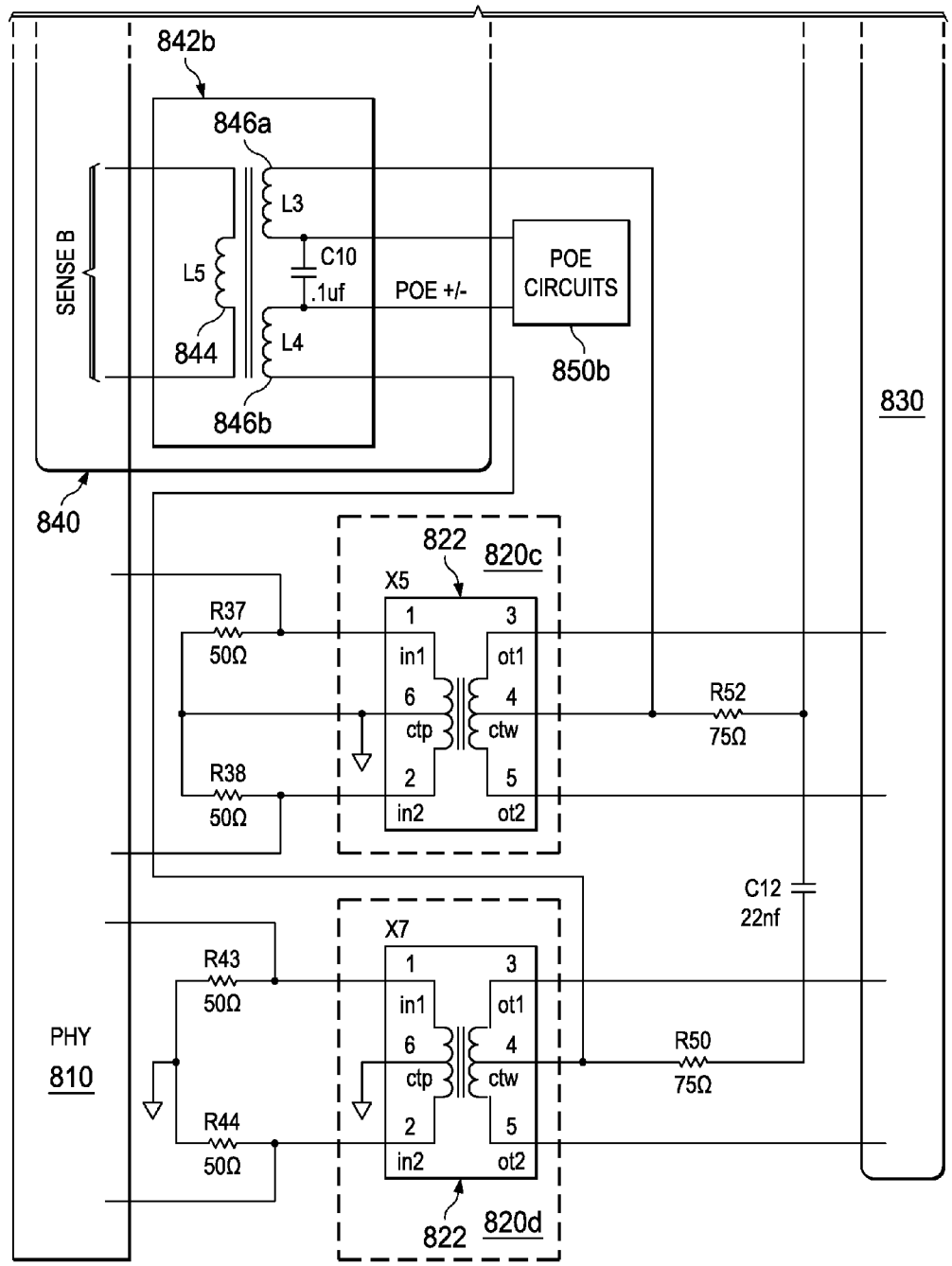

FIG. 8 (inclusive of FIGS. 8A and 8B) illustrates an example system 800 for communication channel diagnostics. System 800 provides an alternate technique to system 200 for the delivery and sensing of common-mode signals. In this illustration, system 800 is a port in an Ethernet environment. In this example, system 800 communicates over a channel that includes four pairs of wires. System 800 could, for example, be part of a network node (e.g., a switch or router) or an end node (e.g., a personal computer or a server). Additionally, system 800 could be in communication with a similar system over a channel.

System 800 includes a physical transceiver 810, magnetics 820, and connectors 830, one for each pair of wires. Physical transceiver 810 is responsible for the hardware send and receive functions for messages. Magnetics 820 are be responsible for, among other things, providing AC coupling to get rid of DC offset, common-mode rejection, and isolation. Connector 830 can be configured for providing a connection to a channel. Connector 830 may, for example, include an RJ-45 connector.

System 800 also includes a common-mode source/sense circuit 840. Source/sense circuit 840 is adapted so that physical transceiver 810 can insert and detect common-mode signals on communication channel wires. As illustrated, source/sense circuit 840 includes two independent transformers 842. Each transformer 842 has its primary 844 associated with two individual windings 846, one for each wire pair. This allows physical transceiver 810 to drive two pairs of wires or four pairs of wires equally from a single source. Individual windings 846 are coupled to a center tap of an associated transformer 822. Coupled to each pair of individual windings 846 is a POE generator 850.

For each set of pairs independently, this technique allows POE to flow through the common-mode magnetic supplying the C2D test signals. Physical transceiver 810 may want to deal with these 'two channels' independently or as a single channel. The POE signal and its return are connected to POE circuitry 850 in such a way as to keep the common-mode magnetics from entering saturation. One feature of this circuitry is that if POE+ is used, active cancellation of saturation on each set of windings may be achieved.

Using the circuitry that it uses for standard messaging (not shown for the sake of simplicity), physical transceiver 810 may sense C2D conversion on each wire pair. Thus, physical transceiver 810 may calculate the C2D conversion on each pair. Additionally, as will be discussed later, this same common-mode energy may be used later to enable alien near-end crosstalk (ANEXT) and CANEXT measurements from the common-mode signaling present on one cable as it "pollutes" other cables in a bundle.

Although FIGS. 2-8 illustrate a variety of systems for communication channel diagnostics, there are additional items to consider in common-mode sourcing and sensing. Among others, these include dealing with line voltages on cables (e.g., 60 Hz noise in the US). For example, the circuitry that senses inside the physical transceiver at the common-mode node may need to have a filter that rejects such noise. This may, for example, be accomplished with a digital filter. Additionally, clamping circuits may be needed inside the physical transceiver to protect from over voltage and transients. Furthermore, common-mode chokes may be added to prevent filtering unwanted noise of the common-mode signal path since it would be measured relative to the ground of the system at the physical transceiver side. In addition, deploying potential discharge circuitry within the physical transceiver could ensure that a pulse is applied at the end of the test, or presenting a bleed high impedance resistance in the case of POE systems could ensure that no excess voltage remains on the filtering capacitor on the attached devices. Thus, while FIGS. 2-8 illustrate example circuitry for communication channel diagnostics, additional components may also be included in embodiments of FIGS. 2-8 to create operational circuits.

Figure 9:
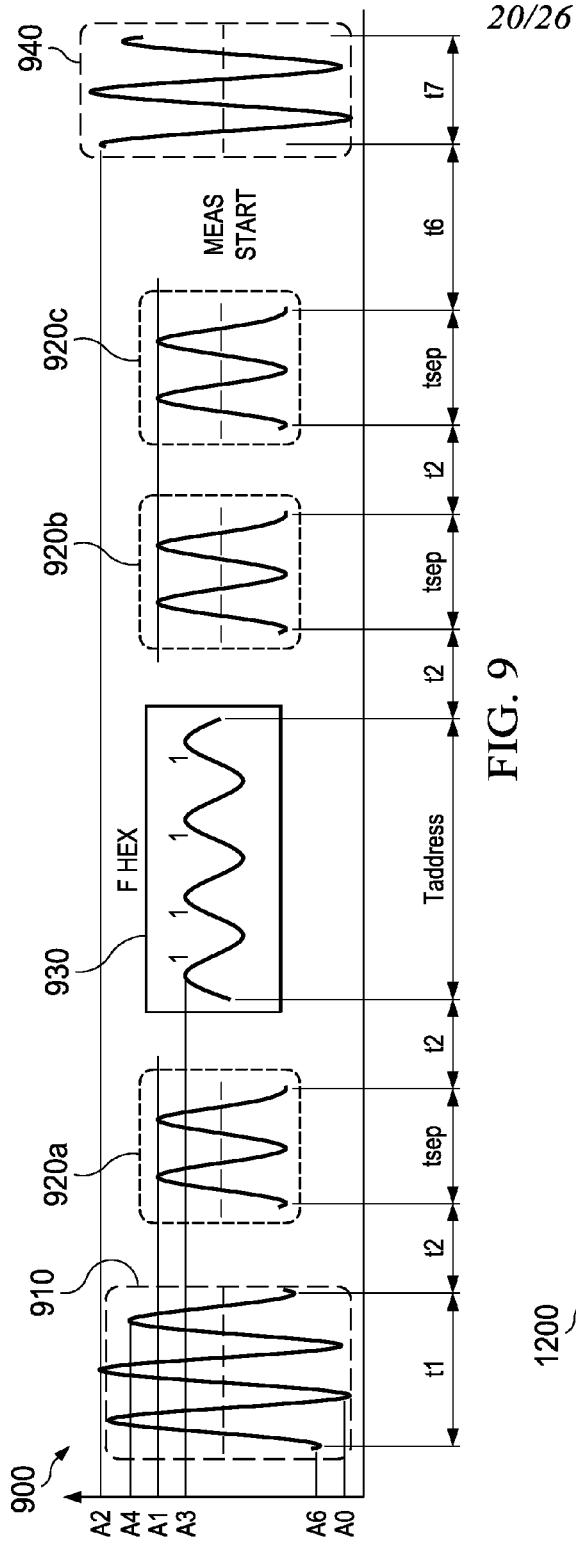
FIG. 9 is a signal diagram illustrating an example communication protocol for communication channel diagnostics.

FIG. 9 illustrates a signal protocol 900 for communication channel diagnostics. Protocol 900 is designed to minimize data interference and send the identity of the test signal sourcing port address (e.g., Media Access Control (MAC) address), port number, IP address, or other appropriate identifier). To begin, a start of test signal 910 is sourced. This signal is unique in its format because it contains more than three cycles at one frequency (Ftest) and it has three amplitudes, starting low at A6 for instance, and dipping lower at A0. This allows the other port on the communication channel, along with ports on other channels if there is cross talk, to determine that a test is about to start. Many variations exist and may be used as long as the signal is unique enough to prevent a false detection. Next, a data separator signal 920 that has the Ftest frequency of the start of test signal 910 is sourced. As illustrated, this signal has two cycles, but it can have more.

In particular implementations, an effort may be made to keep the frequency the same for all the protocol's overhead signals to improve the immunity of the active data links. These devices may be notching that noise from the spectrum to prevent disruption to active data transfer. The chosen frequency may be agreed upon in a specification or used upon installation where the attached ports "train" to reject an external interference and store its signature in local memory to provide future immunity. In some implementations, the signals may be of relatively short duration (e.g., microseconds) to minimize data corruption. Using notching and short signals may provide for only a minimal amount of data messages being corrupted and having to be retransmitted.

Next, a signal 930 is used to send the first letter of the MAC address for the sourcing port. In this example, the letter is sourced as four binary cycles. In this implementation, the absence of a peak is a digital zero, and the presence of a peak is a digital 1. The results could be decoded according to Table 1 to obtain the hex value of the transmission. The entire MAC address now can be sent using such a coding scheme.

TABLE 1

| Hexadecimal | Binary | Decimal |
|---|---|---|
| 0 | 0000 | 0 |
| 1 | 0001 | 1 |
| 2 | 0010 | 2 |
| 3 | 0011 | 3 |
| 4 | 0100 | 4 |
| 5 | 0101 | 5 |
| 6 | 0110 | 6 |
| 7 | 0111 | 7 |
| 8 | 1000 | 8 |
| 9 | 1001 | 9 |
| A | 1010 | 10 |
| B | 1011 | 11 |
| C | 1100 | 12 |
| D | 1101 | 13 |
| E | 1110 | 14 |
| F | 1111 | 15 |

Figure 10:
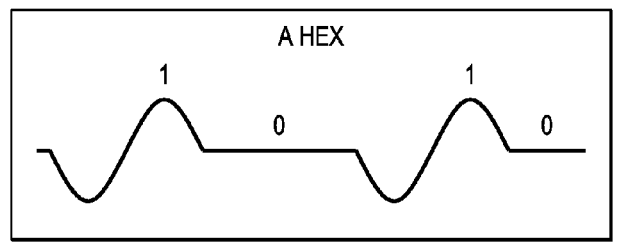
FIG. 10 is a signal diagram illustrating another example communication protocol for communication channel diagnostics.

For instance the Letter "F" in hex is shown in FIG. 9, and the letter "A" in hex is shown in FIG. 10. Thus, the sourcing of a data separator signal 920 followed by the four cycles of the hex code, which may, as illustrated, have lower amplitude, as a double check for instance, may continue until the MAC address has been sourced and the transfer is completed. In other implementations, the MAC address may be sent without data separators between each character. Then, the sequence is terminated with two data separator signals 920 (i.e., two signals back to back). The MAC address signal can also use the frequency of the first signal.

The port identifier may act as a signature for the noise, allowing the source of the noise to be tracked to the sourcing port. If another port is disturbed by the test signaling, the master port can halt the test after being told to do so by the other port. For example, a port in a cable bundle that does not exist on a currently sourcing network node can send an end of the test separator signal using the common-mode sourcing circuit, if available, or send an Ethernet message that has unique content to the proper sourcing MAC address.

The network is typically capable of initiating such request via normal data exchanges or using the disclosed common-mode circuitry shared. The end of test separator signal may take on any unique signature of its own, similar to the start of test signal, for example, and the signals may be amplitude frequency or phase modulated. For improved immunity, a unique frequency may be chosen for the overhead signals. The time separating "data" such as the MAC address and the overhead signals may be fixed or modulated to convey information. In particular implementations, it may be desirable to have the delays as known time values (e.g., set and agreed upon). In some implementations, most of these delays would be made programmable.

If the network topology allows and a cable bundle is configured to a map that is known to attached network nodes (e.g., switches), the identifier of the common-mode sourcing port can be broadcast over the network. The bundle can be shared among different network nodes and such a unique packet may be transmitted over the network to identify the start of the test. In addition, the sourcing node that sends this packet can listen to objections and abort the test before it starts or during the test. Similar to the common-mode domain, the network has the intelligence to handle this also. Using routine data transfer, for instance, a port can broadcast an agreed upon start of test message to all ports on the network to solicit objections and warn adjacent nodes that common-mode signaling will be deployed. Some of the listening ports may initiate their own sensing mode to detect any interference and may report results or share it to other nodes or a user using standard messaging. An end of test message may also be sent. In addition, some of these activities may be used under the command of a user in a debug mode, or upon data disruption to assess the offending source and detect weaknesses in the network.

The test signals are typically of small amplitude and many variations are possible. In certain implementations, a sequence of sine waves is generated and sent out in a predetermined order after the port identifier has been sent. Using sine waves may avoid EMI problems and allow a frequency to be isolated. For example, successive signals with frequencies of 25 MHz, 50 MHz, 75 MHz . . . 400 MHz may be sent. The chosen frequencies may be based on what is readily available in the physical transceiver and what it can process (e.g., by dividing and multiplying an internal signal source). The signals are generated internally and sequenced out based in a pre-configured order.

The order of the frequencies in the sequence and the delay among them in a sequence may be a function of a number of variables (e.g., MAC address, IP address, network node ID, port number, etc.). These can be encoded to allow adjacent ports and the channel partner to distinguish the test signals from a random noise event or a non-intentional test signal. The sine waves can be modulated in a number of ways (e.g., amplitude, frequency, or phase). There is almost no limit on the signal's identity. In addition, a single tone as mentioned earlier may be deployed.

Furthermore, variation may be used as a function of when the test is executed. In a live network, this should be done with care and a single tone with a predicted next frequency and maximum amplitude may be used. This may allow the signals to operate while data is active on one or more communication channels at the same time.

Figure 11:
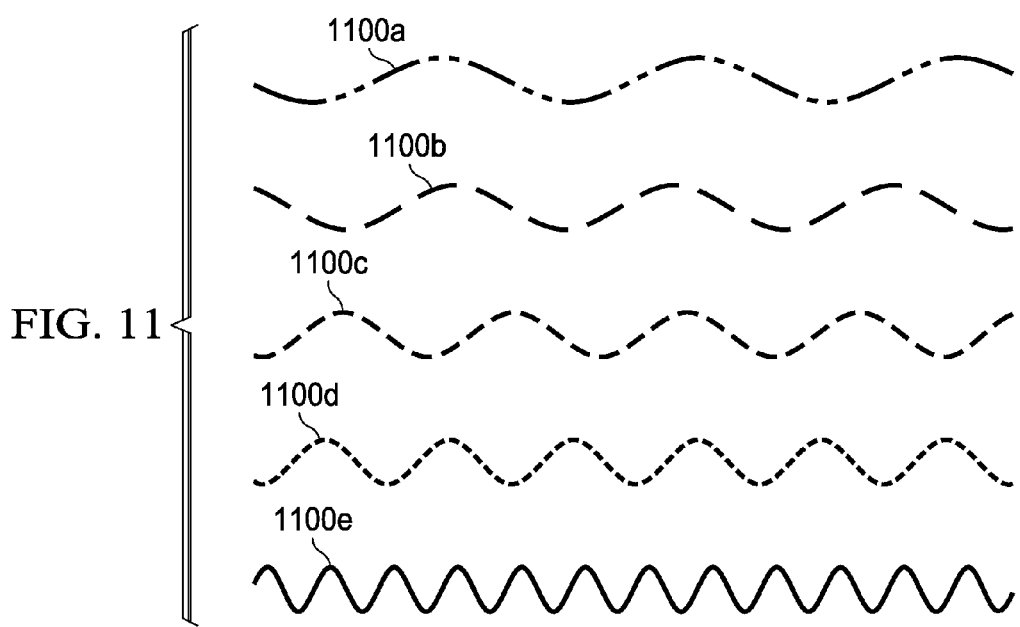
FIG. 11 is a signal diagram illustrating another example communication protocol for communication channel diagnostics.

FIG. 11 illustrates example signals 1100 for communication channel diagnostics. Signals 1100 are at different frequencies and could be sourced one at a time while the test is executed. Signals 1100 could be sent after the port identifier has been sent. Additionally, there can also be a period of delay following the delivery of the port identifier to detect any objections to the test's execution in a live network.

Figure 12:
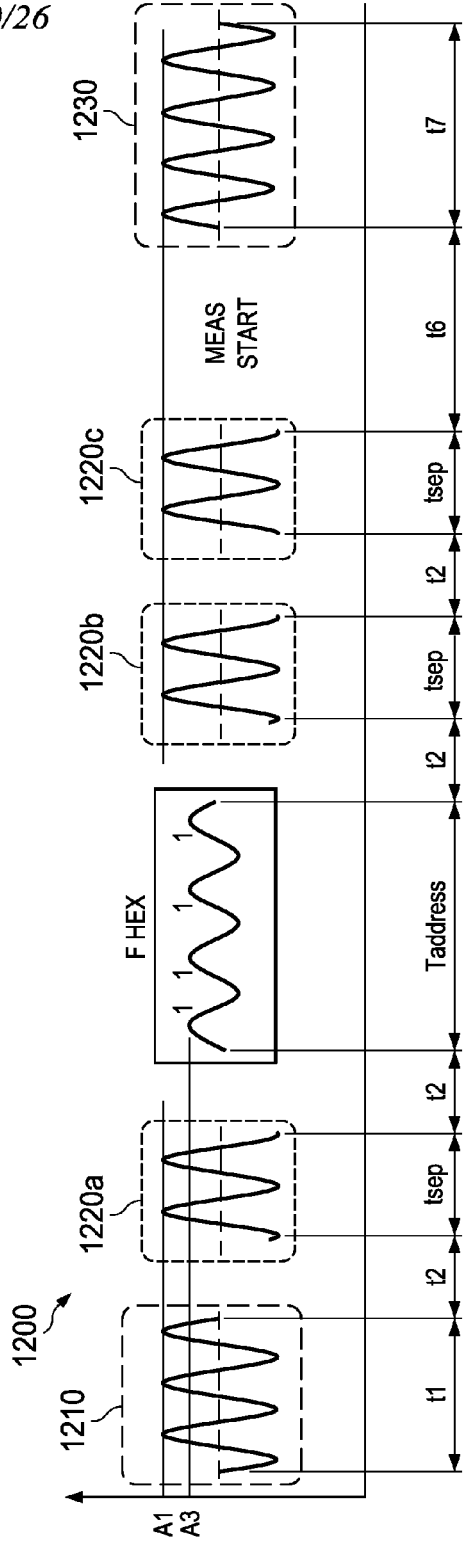
FIG. 12 is a signal diagram illustrating another example communication protocol for communication channel diagnostics.

FIG. 12 illustrates another signal protocol 1200 for communication channel diagnostics. For test protocol 1200, a single frequency, with potentially a single amplitude, is used for the start of test signal 1210, data separator signals 1220, and the end of the test signal 1230. A different number of cycles would be used to identify each type of signal. For example, three cycles may be used for the start of test signal 1210. Moreover, where the signal starts in the cycle along with the number of cycles may present a unique identity for identifying the start of test signal 1210, data separator signals 1220, and the end of test signal 1230.

Data separators may or may not be used when the real measurements start. The frequency and amplitude may be adjusted automatically at that stage until the end of test signal is broadcasted. In certain implementations, other physical transceivers that might receive the common-mode signal (e.g., by ANEXT or CANEXT) may be programmed to be immune to the frequency (e.g., through a notch). Thus, errors due to the text may be avoided on other channels. Signal protocols 900 and 1200 could be useful for conducting communication channel diagnostics. They are relatively easy to implement and can aid in immunity of adjacent link partners.

Although FIGS. 9 and 12 illustrate two signaling protocols for communication channel diagnostics, in general, any type of signal manipulation (e.g., frequency modulation, phase modulation, single tone, dual tone, and/or amplitude modulation) may be deployed for these purposes. Additionally, the amplitude of the signals may be adjusted depending on the operational state of the communication channel. At installation time, when no active data is present, the amplitude may be increased. When data is active, the amplitudes may be reduced in an effort to keep the common to common for CANEXT among channel coupling at a relatively small number (e.g., small enough to keep the differential conversion factor below 10 mv on a channel).

Additionally, while FIGS. 9 and 12 illustrate how the delivery of the identity of the source may be made, similar encoding schemes, if needed, may be used to deliver the identifier of the sourcing node, an Internet Protocol (IP) address of the sourcing node, and/or any other information that is desirable. For example, the sequence of the sourced frequencies can itself encode other data such as a port number or an IP address. In one particular scenario, sourcing a 25 MHz signal followed by 50 MHz can be a digital one, but jumping to 100 MHz and then back to 75 MHz can be a digital zero. The test is executed as measurements are made at different frequencies for the sake of measuring the C2D, but the system does not need to restrain the order of the sourced frequency as long as it is defined or broadcasted ahead. This way, for instance, the Vdnoise value is calculated, but at the same time, more information about the sourcing port conducting the test is being delivered.

If adjacent ports need to know what the next frequency would be to notch the noise at that frequency ahead of transmission, and possibly expect some predefined number of cycles and set the averaging algorithm, the number of cycles at a frequency may be used to encode the next frequency. For example, if the sourcing port started at 25 MHz, then an odd number of cycles could mean it is moving to 75 MHz (i.e., three times), and an even number of cycles could mean it is moving to 50 MHz (i.e., two times). Alternatively, the number of cycles repeated twice or three times (to do some averaging) may provide a finer increment. For example, twenty-six cycles may mean 26 MHz.

Additionally, the delay between one frequency of a sine wave and the next also may be modulated among two or more time slots and decoded to help broadcast the identity of the source to identify the offending port for ANEXT/CANEXT purposes. The delay time (Td) again may be set by radiated EMI conditions.

Furthermore, the sequence order (e.g., a frequency pattern of 25 MHz followed by 100 MHz followed by 75 MHz) along with the delay among such frequencies (e.g., 1 usec or 10 usec between two frequencies in the sequence) may encode the additional information to help adjacent ports extract such information as the source port identifier (e.g., MAC address and some other switch ID, IP address, port number, switch address, etc.), an IP address, or any parts thereof. In certain implementations, a table may need to be set to encode and decode such things.

For a frequency sweep to 400 MHz with 25 MHz steps, there are sixteen frequencies in the sweep. Thus, proper sourcing and delay modulation can produce a 16-bit address that can be decoded to identify the sourcing port while also allowing measurement of the C2D sequence in parallel. In addition, multiple sequences may be deployed as defined for the Ethernet auto-negotiation if more information is desired for ANEXT/CANEXT port identification. These frequencies can be generated on board of the physical transceiver from an incoming clock, digitally processed, and gated via one of the digital-to-analog (D/A) converters used for the data channels via a multiplexer (MUX) in a special mode. Thus, there is no need to add a dedicated D/A. If a pulse shape is adopted in parallel to the above approach as a supplement, the time delay among pulses and the pulse shape should not constitute a radiated EMI hazard. Additionally, the total time of common-mode sourcing (dwell time) and the signals amplitude may have to be limited to keep EMI under control.

In certain modes of operation, a separate mode is used upon the installation of a new network node where data is not active on the bundle of cables incoming to the node. Before data transfer takes place, a multi-port C2D set of measurements may be initiated where each port in a sequence starts a test while the other ports listen until all ports with cables attached have completed. Based on the results that are stored to local system memory, more cases may be executed where the sourcing may be done on more than one port at once to see the cumulative effect on different channels. In some implementations, the source may be synchronized (i.e., the same frequency and step in the process is executed at the same time), and in others different frequencies are executed at the same time and the results are calculated.

Failing and passing limits may be established based on the minimum rejection required by the standard and the real system noise floor/channel quality established at the site. If the C2D is excessive (e.g., below 20 db), an alert for a user (e.g., installer) is generated. The alert may, for example, attempt to notify the installer to change connectors and/or cables or to do a hand check using a field tester before the links are declared operational.

Such a test is useful where all channels would be characterized as attached among the systems with the exact location of the cables at installation time, and any potential offenders are remedied with a change of channel/infrastructure or simply by separation (i.e., leaving some cables/channels unused). Different nodes on the network may store the results in their local memory as look up tables, compare them to a local reference (e.g., look-up table), identify any weak links, and share the C2D results among themselves. The results on a node or system basis may be managed using common data transfer protocols through a proprietary or standard scheme agreed upon to allow a user to have a map of noise tolerance.

A map may, for example be a graphical presentation of the proximity of cables in a bundle as they map to different ports on the network with colors that show the color green for cables that pass the specification as stored in the local look-up table and orange for marginal links and red for any cables in the bundle that see excess C2D, D2D, or total NEXT (the sum of all noise sources activated at once). Different conditions may be shown. Upon installation, the map may reflect the noise floor (i.e. the presence of any ambient noise) and may store this data for future viewing and for the sake of detecting changes in the noise floor pre and post system installation. Such a network map could be displayed using a graphical user interface and indicate the hot spots in the network.

While this technique uses the common-mode as its source, similar methodology may be deployed in which the common-mode sourcing port flags its presence at test start, but this time no common-mode sourcing takes place. Instead, a differential signal (e.g., data) is sourced, and the listening ports, having measured the C2D characteristics, now measure the D2D characteristic and any common-mode signaling that results from the data transfer. This is similar to the test specified in TIA cable standard and known as ANEXT. The advantage of this, however, is that the C2C, having identified the sourcing cable to the rest of the cables in the bundle, gives the adjacent ports the capability of measuring the noise from the data now. Additionally, the effects of more circuitry (e.g., magnetics, filters, etc.) could be taken into account and analyzed.

Another implementation may be used where more than one port is sourcing common-mode at the same time and multiple ports are measuring ANEXT, CANEXT, or both at the same time. This allows the network to potentially identify the victim cable and to calculate the noise on it in real time under differential and/or common-mode to detect its immunity at installation time. If it is deemed marginal, its use may be ignored, or it may be used for other purposes. During this test, each port could measure the sum of noise present from the adjacent ports being active at once in the bundle.

In implementations in which differential ANEXT is being analyzed, a network node could also source common-mode. This could allow the total noise on the system to be measured. For example, differential noise could first be sourced and then a common-mode insertion could be sourced, and the total noise measured. Any other nodes have the ability to know which port is actively being tested and which port(s) are being measured. Additionally, the effect of the circuitry (e.g., filter, magnetics, connector, common-mode terminations, etc.) and the effect of the entire communication channel on the measurement may be analyzed. Moreover, the analysis may be performed on both ends of the communication channel, which may provide more accurate results.

A handheld tester does not have the ability to take the extra circuitry into account. In addition, a handheld tester has its own connector-plug, which is likely to be a different brand than the one in the connected communication network and the plug (i.e., cable is different). Thus, the C2D and C2C per cable would likely be different, which could affect the measurements. Sourcing the test signal from a network node, therefore, provides a more accurate analysis of the system.

Additionally, such a test can provide insight into which port in a system is the most susceptible and can be used to troubleshoot when a problem occurs. Moreover, one or more channels can be sourced in various combinations, which may provide enhanced results. At best, a handheld tester might test seven cables either individually, keeping track of the noise on the rest and executing a sum algorithm, or by exciting all cables at once and doing a single measurement on each cable. The described system, however, could potentially insert common-mode on 24 or 48 channels or more and emulate the algorithm of any tester (i.e., do a single measurement on each cable when all are excited at the same time or excite each cable alone and do a summing algorithm to find the total noise).

Figure 13:
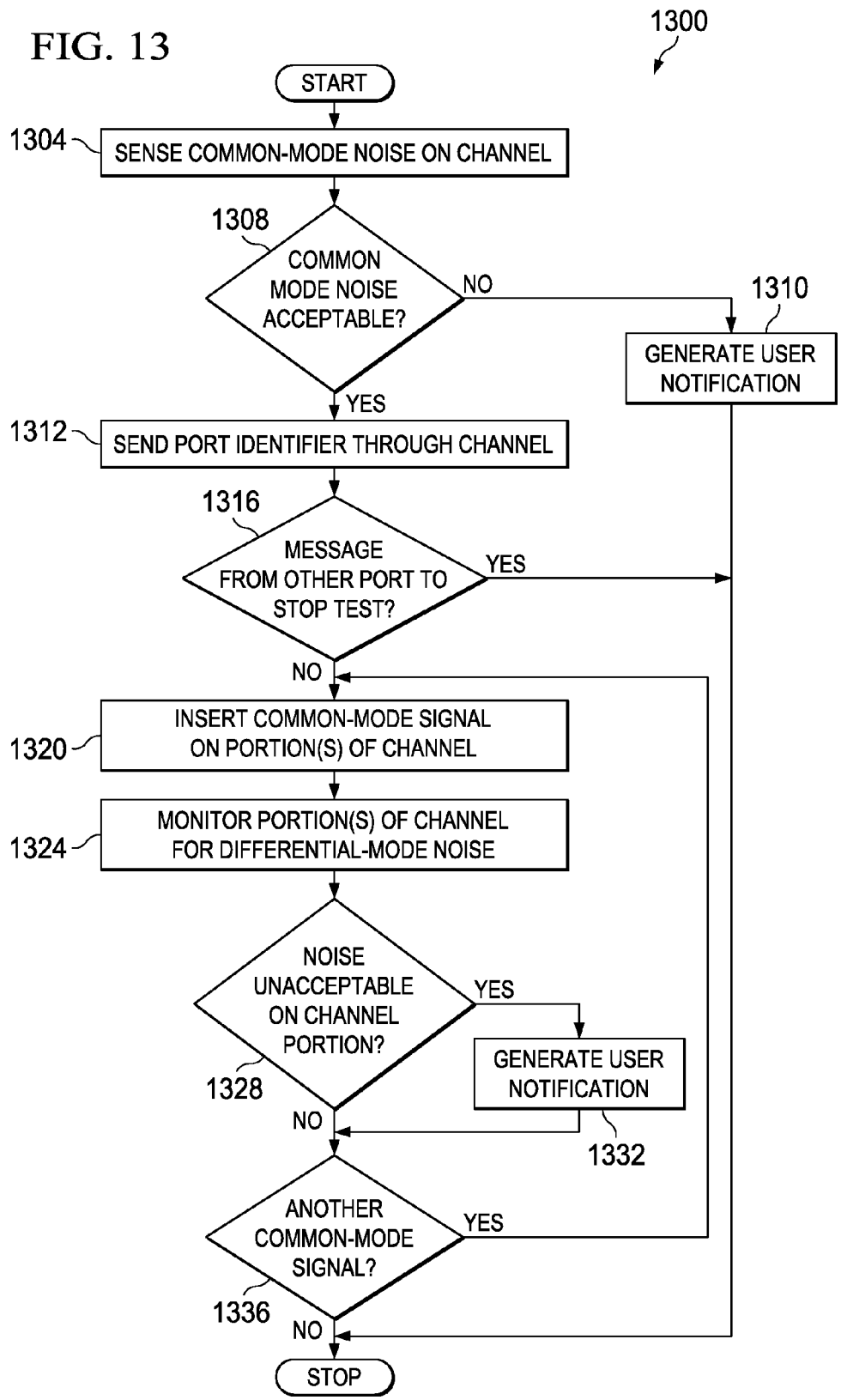
FIG. 13 is a flowchart illustrating an example process for communication channel diagnostics.

FIG. 13 illustrates an example process 1300 for communication channel diagnostics. Process 1300 may, for example, be implemented by a network node (e.g., a switch or router) or an end node (e.g., a personal computer or server). Process 1300 calls for sensing common-noise on a channel to be tested (operation 1304). The common-mode noise could, for example, exist due to environment sources (e.g., RF) in the vicinity of the channel. Process 1300 also calls for determining whether the common-mode noise on the channel is acceptable (operation 1308). The common-mode noise may, for example be acceptable if it is below a certain power level, as reflected by the C2D or the effective equivalent differential noise. A look-up table with voltage over frequency for C2D could be used as a reference and stored locally in the system, at manufacturing time, for example. The table could also be altered based on the real network measurement. Such modification may reflect the cable lengths at hand and, potentially, help tune the signal amplitude on each port to increase the signal to noise ratio (allowing a looser C2D specification). For example, 10 GBaseT has an amplitude attenuation algorithm built into the standard where the amplitude generated at the source is attenuated based on a cable length measurement done in real time before the link is established. Based on the additional noise measurements discussed herein, the amplitude can be increased or decreased to optimize data transfer in the presence of additional noise from adjacent channels. Typical differential noise limits may be on the order of a few millivolts for 10 GbaseT and vary with speed.

If the common-mode noise is not acceptable, process 1300 calls for generating a user notification (operation 1310). The notification may, for example, alert a user (e.g., IT manager) to investigate the potential noise source. The user may, for instance, be able to place all ports in listening mode to detect which port has the maximum noise for easy debug in tracking the source. Process 1300 is then at an end.

If, however, the common-mode noise is acceptable, process 1300 calls for sending a port identifier through the channel (operation 1312). A port identifier may, for example, be a MAC address. Process 1300 also calls for determining whether a message has been received from another port to stop the test (operation 1316). Another port may, for example, determine that the test is interfering with its operations. The other port may contact the sourcing port using the port identifier (e.g., using Ethernet messages).

If there is a message from another port to stop the test, process 1300 is at an end. If, however, there is not a message from another port to stop the test, process 1300 calls for inserting a common-mode signal onto one or more portions of a channel (operation 1320). The common-mode signal may, for example, be inserted onto one or more pairs of wires in a Category 6/6a cable. Process 1300 also calls for monitoring one or more portions of the channel for differential-mode noise (operation 1324). The portions may, for example, be monitored using a physical transceiver used for standard messaging. Thus, the differential-mode noise may be monitored in real time. The channel portions may be monitored at the sending node (e.g., network switch) and/or receiving node (e.g., NIC). The receiving nodes may exchange data through standard messaging.

Process 1300 also calls for determining whether the differential-mode noise on a channel portion is unacceptable (operation 1328). Determining whether noise on a channel portion is unacceptable may, for example, be accomplished by comparing the received noise level on the channel portion against an acceptable noise level, which could be stored in a table. If the noise is unacceptable on a channel portion, process 1300 calls for generating a user notification (e.g., a message).

If the noise is not unacceptable on a channel portion, process 1300 calls for determining whether there is another common-mode signal to insert in the channel (operation 1336). In particular implementations, for example, a test may call for signals at different frequencies to be inserted into the channel. If there is another common-mode signal to insert in the channel, process 1300 calls for inserting the common-mode signal into one or more portions of the channel (operation 1320) and monitoring one or more portions of the channel for differential-mode noise (operation 1324). If, however, there is not another common-mode signal to insert into the channel, process 1300 is at an end.

Process 1300 could be executed at installation, on a periodic basis, or upon demand. Thus, process 1300 could be performed multiple times for a system. Moreover, process 1300 may be aborted any time under the control of a user or using network packets broadcasted along the network data paths to all ports on a LAN.

Although FIG. 13 illustrates one example implementation of a process for communication channel diagnostics, other processes for communication channel diagnostics could include fewer, additional, and/or a different arrangement of operations. For example, a process may not include sensing common-mode noise before performing a test. As another example, a process may not include sending a port identifier before performing a test. As an additional example, a process could include sensing common-mode noise during a test. This allows the detection of both differential-mode and common-mode noise and may help ease the detection of any sudden external common-mode noise that may suddenly appear during the test. As a further example, user notifications could be generated after a test is complete. As another example, a process may call for continually checking for a message from another port to stop the test. As a further example, a process may call for storing the results of the test for later analysis.

As mentioned previously, in particular implementations, a network node may have a number of ports (e.g., 2-16), and the communication channels for the ports may affect each other in a differential manner through common-mode cross talk. In a fairly common configuration, a cable may be surround by six others (i.e., a 6:1 configuration), and thus, there may be six potential sources of alien near-end cross talk (ANEXT/CANEXT). In some cases, the victim cable may receive additive noise from each surrounding cable.

Typically, common-mode cross talk from one channel to another channel is not regarded as much of a concern since this is just common-mode noise and may be readily handled by the infringed upon channel. However, as discussed earlier, this common-mode noise may be converted into differential noise on the infringed upon channel, which may affect the message on the channel. In fact, although the coupled common-mode noise may be an order of magnitude lower than that on the originating channel, the converted differential noise may be much higher than the differential noise to differential noise coupling between channels.

To address this, one or more channels of the network node may be excited at a known frequency to the ports on the network node, and the rest of the ports may analyze the signature of the results synchronously. If an unacceptable level of noise occurs on an adjacent channel, a notification may be generated for a user.

Figure 14:
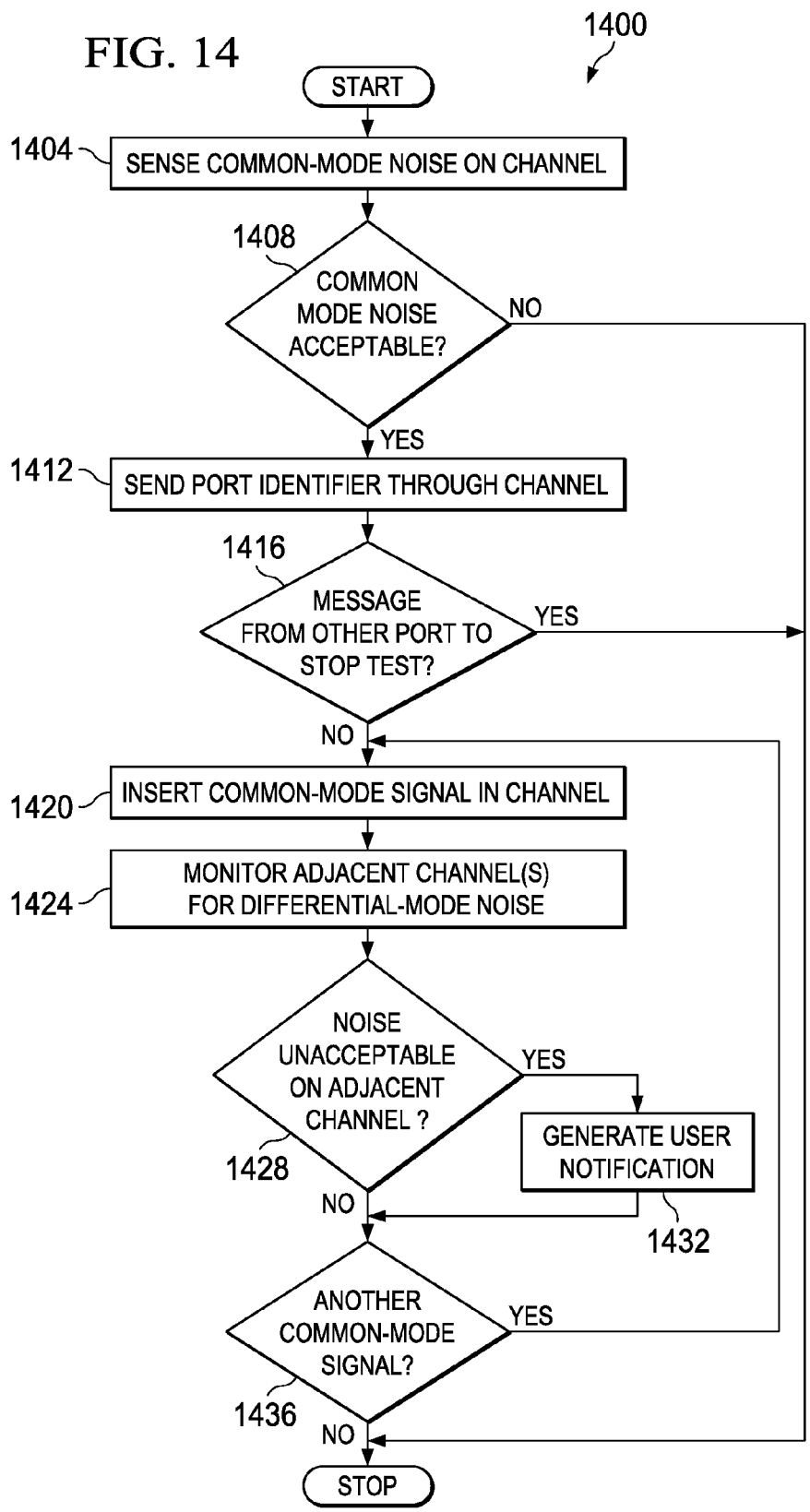
FIG. 14 is a flowchart illustrating an example process for communication channel diagnostics.

FIG. 14 illustrates a process 1400 for communication channel diagnostics. Process 1400 may, for example, be implemented by a switch or a NIC. Process 1400 calls for sensing common-noise on a communication channel to be tested (operation 1404). The common-mode noise could, for example, exist due to environment sources (e.g., RF) in the vicinity of the channel. Process 1400 also calls for determining whether the common-mode noise on the channel is acceptable (operation 1408). The common-mode noise may, for example, be acceptable if it is below a certain power level. If the common-mode noise is not acceptable, process 1400 is at an end.

In certain implementations, a user (e.g., IT manager) may be notified to track the source of the problem. Under some circumstances, the local node (e.g., data switch or NIC) may have an interface to handheld equipment to exchange measurement data upon installation. Such an interface could take place via a regular Ethernet port on the local node or over the World Wide Web ("Web") via an IP address and web browser to a software module running on the local node for that purpose. The data out of the tester can be downloaded to the local node or vice versa. The data can help detect any deficiencies resulting from the limited capabilities of a tester that may have a different connector that does not match that of the real hardware and its limited capabilities of driving more than six to seven cables at a time while keeping track where each cable is connected in a real network. In helping a user debug, the local node may download its data to the tester and help the user do a handheld measurement on a channel while, for example, modifying patch cords or moving cables to help solve a problem. In other cases, measurement data may be accessible over the Web for remote debug, and can be accessible graphically and as a table.

If, however, the common-mode noise is acceptable, process 1400 calls for sending a port identifier through the channel (operation 1412). A port identifier may, for example, be a MAC address. Process 1400 also calls for determining whether a message has been received from another port to stop the test (operation 1416). Another port may, for example, determine that the test is interfering with its operations. The other port may contact the sourcing port using the channel identifier (e.g., using Ethernet messages).

If there is a message from another port to stop the test, process 1400 is at an end. If, however, there is not a message from another port to stop the test, process 1400 calls for inserting a common-mode signal into the channel (operation 1420). The common-mode signal may, for example, be inserted onto each pair of wires in a Category 6 cable. Process 1400 also calls for monitoring one or more adjacent communication channels for differential-mode noise (operation 1424). The adjacent channel(s) may, for example, be monitored using the physical transceivers used for standard messaging. The channels may be monitored at the sending node (e.g., network switch) and/or receiving node (e.g., NIC). The receiving nodes may exchange data through standard messaging.

Process 1400 further calls for determining whether the differential noise on an adjacent channel is unacceptable (operation 1428). Determining whether the differential noise on an adjacent channel is unacceptable may, for example, be accomplished by comparing the received noise level on the channel against an acceptable noise level, which could be stored in a table. If the noise is unacceptable on an adjacent channel, process 1400 calls for generating a user notification (e.g., a message).

If the noise is not unacceptable on an adjacent channel, process 1400 calls for determining whether there is another common-mode signal to insert in the channel (operation 1436). In particular implementations, for example, a test may call for common-mode signals at different frequencies to be inserted into the channel. If there is another common-mode signal to insert in the channel, process 1400 calls for inserting the common-mode signal into the channel (operation 1420) and monitoring the adjacent channel(s) for differential-mode noise (operation 1424). If, however, there is not another common-mode signal to insert into the channel, process 1400 is at an end. Process 1400 could be executed at installation, on a periodic basis, or upon demand. Thus, process 1400 could be performed multiple times for a system.

Although FIG. 14 illustrates one example implementation of a process for communication channel diagnostics, other processes for communication channel diagnostics could include fewer, additional, and/or a different arrangement of operations. For example, a process may not include sensing common-mode noise before performing a test. As another example, a process may not include sending a port identifier before performing a test. As a further example, a process could include sensing common-mode noise during a test. As an additional example, user notifications could be generated after a test is complete. As another example, a process may call for continually checking for a message from another port to stop the test. As a further example, a process may call for storing the results of the test for later analysis.

Figure 15:
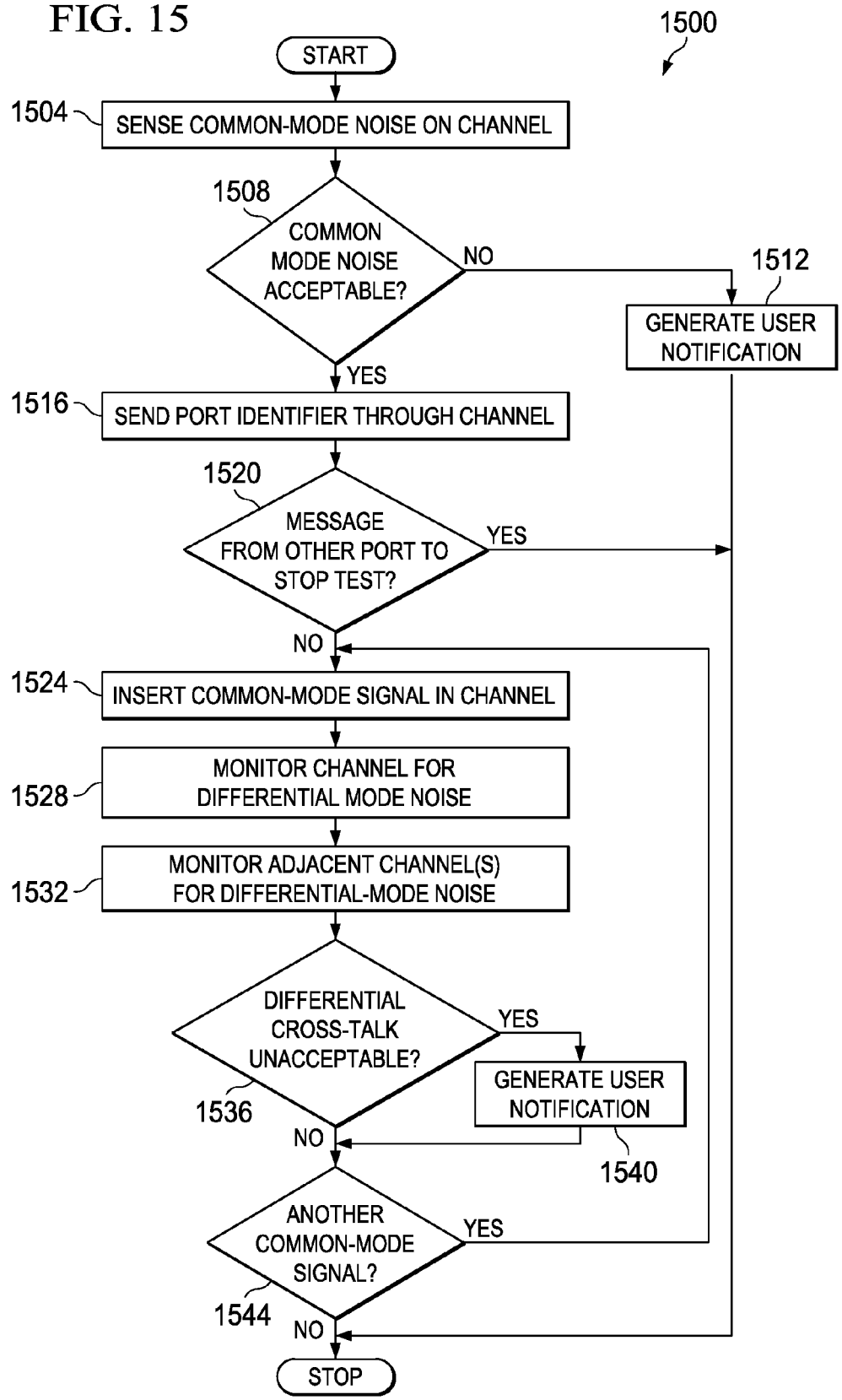
FIG. 15 is a flowchart illustrating an example process for communication channel diagnostics.

FIG. 15 illustrates another process 1500 for communication channel diagnostics. Process 1500 may, for example, be implemented by a switch or a NIC. Process 1500 calls for sensing common-mode noise on a communication channel to be tested (operation 1504). The common-mode noise could, for example, exist due to environment sources (e.g., RF) in the vicinity of the channel. Process 1500 also calls for determining whether the common-mode noise on the channel is acceptable (operation 1508). The common-mode noise may, for example, be acceptable if it is below a certain power level.

If the common-mode noise is not acceptable, process 1500 calls for generating a user notification (operation 1512). The notification may, for example, alert a user (e.g., IT manager) to investigate the potential noise source. The user may, for instance, be able to place all ports in listening mode to detect which port has the maximum noise for easy debug in tracking the source. Process 1500 is then at an end.

In certain implementations, a user (e.g., IT manager) may be notified to track the source of the problem. Under some circumstances, the local node (e.g., data switch or NIC) may have an interface to handheld equipment to exchange measurement data upon installation. In other cases, measurement data may be accessible over the Web for remote debug, and can be accessible graphically and as a table. If, however, the common-mode noise is acceptable, process 1500 calls for sending a port identifier through the channel (operation 1516). A port identifier may, for example, be a MAC address. Process 1500 also calls for determining whether a message has been received from another port to stop the test (operation 1520). Another port may, for example, determine that the test is interfering with its operations. The other port may contact the sourcing port using the channel identifier (e.g., using Ethernet messages).

If there is a message from another port to stop the test, process 1500 is at an end. If, however, there is not a message from another port to stop the test, process 1500 calls for inserting a common-mode signal into the channel (operation 1524). The common-mode signal may, for example, be inserted onto each pair of wires in an Ethernet cable. Process 1500 also calls for monitoring the communication channel for differential-mode noise (operation 1528). Monitoring for differential-mode noise may, for example, be accomplished with the circuitry used for standard messaging.

Process 1500 also calls for monitoring one or more adjacent communication channels for differential-mode noise (operation 1532). The adjacent channel(s) may, for example, be monitored using the physical transceivers used for standard messaging. The channels may be monitored at the sending node (e.g., network switch) and/or receiving node (e.g., NIC). The receiving nodes may exchange data through standard messaging.

Process 1500 also calls for determining whether the differential cross talk is unacceptable (operation 1536). Determining whether differential cross talk is unacceptable may, for example, be accomplished by comparing the differential noise on the insertion channel with the differential noise on the adjacent channel(s). A 40 dB differential isolation may, for example, be desirable. If the differential crosstalk is unacceptable, process 1500 calls for generating a user notification (e.g., a message) (operation 1540).

If the differential cross talk is not unacceptable, process 1500 calls for determining whether there is another common-mode signal to insert in the channel (operation 1544). In particular implementations, for example, a test may call for common-mode signals at different frequencies to be inserted into the channel. If there is another common-mode signal to insert in the channel, process 1500 calls for inserting the common-mode signal into the channel (operation 1524) and monitoring the channel (operation 1528) and the adjacent channel(s) (operation 1532) for differential-mode noise. If, however, there is not another common-mode signal to insert into the channel, process 1500 is at an end. Process 1500 could be executed at installation, on a periodic basis, or upon demand. Thus, process 1500 could be performed multiple times for a system.

Although FIG. 15 illustrates one example implementation of a process for communication channel diagnostics, other processes for communication channel diagnostics could include fewer, additional, and/or a different arrangement of operations. For example, a process may not include sensing common-mode noise before performing a test. As another example, a process may not include sending a port identifier before performing a test. As a further example, a process could include sensing common-mode noise during a test. As an additional example, user notifications could be generated after a test is complete. As another example, a process may call for continually checking for a message from another port to stop the test or both a differential-mode and a common-mode signal at the same time. As an additional example, a process may include inserting a differential-mode signal to perform the test. As a further example, a process may call for storing the results of the test for later analysis. In particular implementations, common-mode signals may be inserted onto different communication channels at the same time. For example, common-mode signals may be inserted into two or four channels at the same time.

Figure 16:
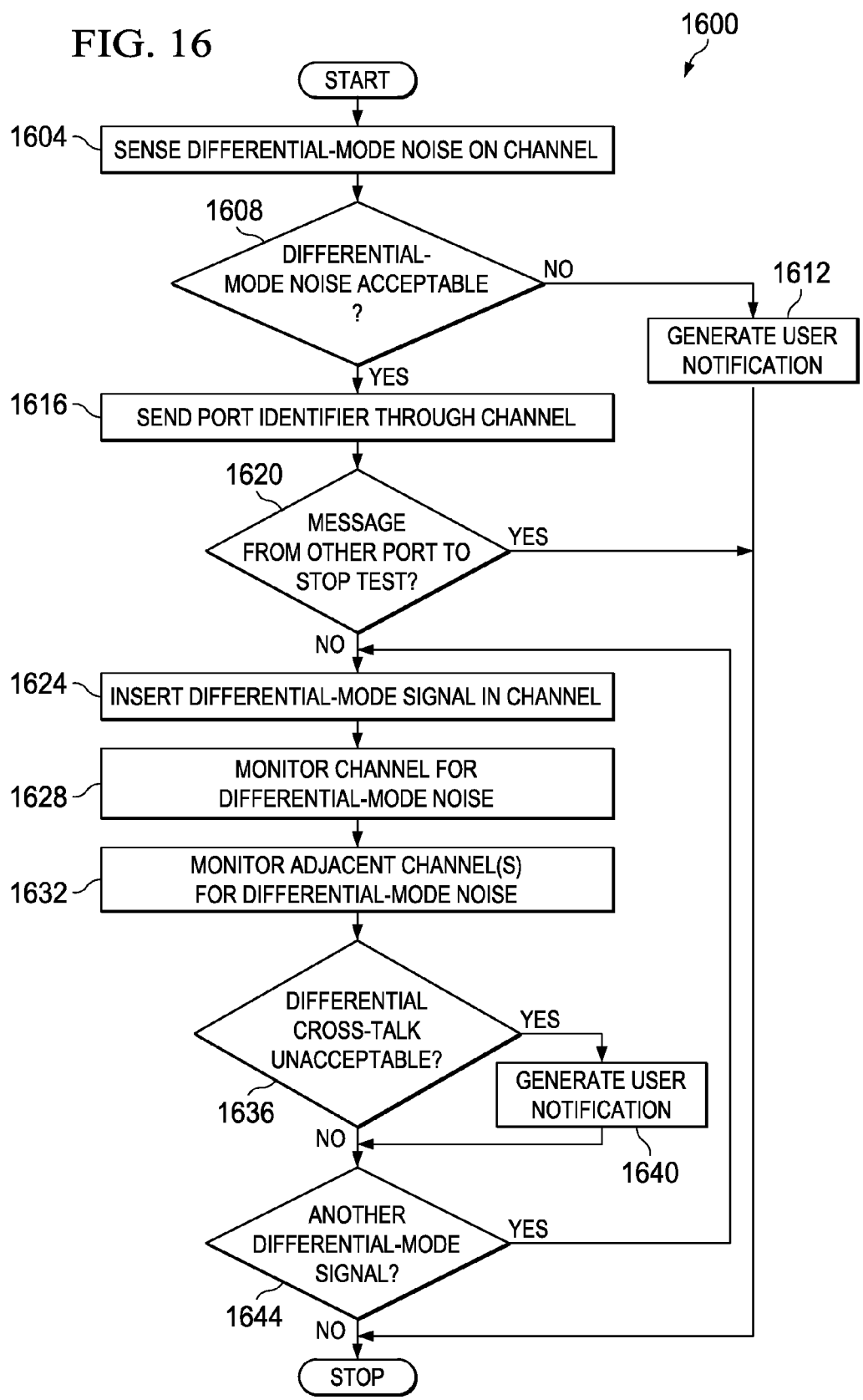
FIG. 16 is a flowchart illustrating an example process for communication channel diagnostics.

FIG. 16 illustrates a process 1600 for communication channel diagnostics. Process 1600 may, for example, be implemented by a switch or a NIC. Process 1600 calls for sensing differential-mode noise on a communication channel to be tested (operation 1604). The differential-mode noise could, for example, exist due to environment sources (e.g., RF) in the vicinity of the channel. Process 1600 also calls for determining whether the differential-mode noise on the channel is acceptable (operation 1608). The differential-mode noise may, for example, be acceptable if it is below a certain power level.

If the differential-mode noise is not acceptable, process 1600 calls for generating a user notification (operation 1612). The notification may, for example, alert a user (e.g., IT manager) to investigate the potential noise source. The user may, for instance, be able to place all ports in listening mode to detect which port has the maximum noise for easy debug in tracking the source. Process 1600 is then at an end.

In certain implementations, a user (e.g., IT manager) may be notified to track the source of the problem. Under some circumstances, the local node (e.g., data switch or NIC) may have an interface to handheld equipment to exchange measurement data upon installation. In other cases, measurement data may be accessible over the World Wide Web for remote debug, and can be accessible graphically and as a table.

If, however, the differential-mode noise is acceptable, process 1600 calls for sending a port identifier through the channel (operation 1616). A port identifier may, for example, be a MAC address. Process 1600 also calls for determining whether a message has been received from another port to stop the test (operation 1620). Another port may, for example, determine that the test is interfering with its operations. The other port may contact the sourcing port using the channel identifier (e.g., using Ethernet messages).

If there is a message from another port to stop the test, process 1600 is at an end. If, however, there is not a message from another port to stop the test, process 1600 calls for inserting a differential-mode signal into the channel (operation 1624). The differential-mode signal may, for example, be inserted onto each pair of wires in an Ethernet cable. Process 1600 also calls for monitoring the communication channel for differential-mode noise (operation 1628). Monitoring for differential-mode noise may, for example, be accomplished with the circuitry used for standard messaging.

Process 1600 also calls for monitoring one or more adjacent communication channels for differential-mode noise (operation 1632). The adjacent channel(s) may, for example, be monitored using the physical transceivers used for standard messaging. The channels may be monitored at the sending node (e.g., network switch) and/or receiving node (e.g., NIC). The receiving nodes may exchange data through standard messaging.

Process 1600 also calls for determining whether the differential cross talk is unacceptable (operation 1636). Determining whether differential cross talk is unacceptable may, for example, be accomplished by comparing the differential noise, and possibly signal, on the insertion channel with the differential noise on the adjacent channel(s). A minimum of 40 dB differential isolation may, for example, be desirable. If the differential crosstalk is unacceptable, process 1600 calls for generating a user notification (e.g., a message) (operation 1640).

If the differential cross talk is not unacceptable, process 1600 calls for determining whether there is another differential-mode signal to insert in the channel (operation 1644). In particular implementations, for example, a test may call for differential-mode signals at different frequencies to be inserted into the channel. If there is another differential-mode signal to insert in the channel, process 1600 calls for inserting the differential-mode signal into the channel (operation 1624) and monitoring the channel (operation 1628) and the adjacent channel(s) (operation 1632) for differential-mode noise. If, however, there is not another differential-mode signal to insert into the channel, process 1600 is at an end. Process 1600 could be executed at installation, on a periodic basis, or upon demand. Thus, process 1600 could be performed multiple times for a system.

Although FIG. 16 illustrates one example implementation of a process for communication channel diagnostics, other processes for communication channel diagnostics could include fewer, additional, and/or a different arrangement of operations. For example, a process may not include sensing differential-mode noise before performing a test. As another example, a process may not include sending a port identifier before performing a test. As a further example, a process could include sensing common-mode noise during a test. As an additional example, user notifications could be generated after a test is complete. As another example, a process may call for continually checking for a message from another port to stop the test or both a differential-mode and a common-mode signal at the same time. As an additional example, a process may include inserting both a common-mode signal and a differential-mode signal to perform the test. In some modes of operation, the differential-mode signal and the common-mode signal could be inserted in sequence, and the disparate results analyzed. In other modes of operation, the signals could be inserted at the same time to generate a total noise measurement. In certain modes of operation, common-mode and differential-mode signals could be inserted on multiple channels (e.g., 4, 24, 48, etc.) at the same time. A measurement on each cable could then be performed when all are excited at the same time. In addition, each cable could be excited alone and a summing algorithm performed to find the total noise. As an additional example, a process may call for storing the results of the test for later analysis.

As a further example, a process may include inserting differential-mode signals into different communication channels at the same time. For example, differential-mode signals may be inserted into two or more channels (e.g., 4, 24, 48, etc.) at the same time. A measurement on each cable could then be performed when all are excited at the same time. In addition, each cable could be excited alone and a summing algorithm performed to find the total noise. As an additional example, a process may call for storing the results of the test for later analysis.

In some implementations, a common-mode signal and/or a differential-mode signal may be imposed while data is active on one or more communication channels. Imposing a common-mode signal in addition to the data or transmitting a differential-mode signal while the data is active may be enhanced by using a signal signature that is unique from the data. Unique signal signatures may, for example, be a single or multiple tone signal that is easily distinguishable from the data spectrum. Physical transceivers are typically equipped with a tone generator capability, and generating such signals could be easily achieved using the physical transceivers' processors. As another example, external processors dedicated for this function could be used according to similar methods to take a source of one tone and generate different signals using analog and digital processing techniques. Using a unique signal signature may allow an offending cable (e.g., one that has excessive crosstalk along the channel) to be identified. Such signal insertions may be used during a debug mode to help isolate the major contributor to differential crosstalk among the cables in the bundle.

The flowcharts and block diagrams in the figures illustrate the architecture, functionality, and operation of systems, methods, and computer program products of various implementations of the disclosure. In this regard, each block in the flowchart or block diagrams may represent a module, segment, or portion of code, which can include one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or the flowchart illustration, and combination of blocks in the block diagrams and/or flowchart illustration, can be implemented by special purpose hardware-based systems that perform the specified function or acts, or combinations of special purpose hardware and computer instructions. As will be appreciated by one skilled in the art, aspects of the present disclosure may be implemented as a system, method, or computer program product. Accordingly, aspects of the present disclosure may take the form of an entirely hardware environment, an entirely software embodiment (including firmware, resident software, micro-code, etc.), or an implementation combining software and hardware aspects that may all generally be referred to herein as a "circuit," "module," or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure, a computer readable storage medium may be a tangible medium that can contain or store a program for use by or in connection with an instruction execution system, apparatus, or device.

A computer readable signal medium may include a propagated data signal with computer readable program code embodied therein, for example in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any medium, including but not limited to wireless, wireline, optical fiber cable, RF, etc. or any suitable combination of the foregoing.

Computer program code for carrying out operations for aspects of the disclosure may be written in any combination of one or more programming languages such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosure are described with reference to flowchart illustrations and/or block diagrams of methods, apparatus (systems), and computer program products according to implementations. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other device to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions that execute on the computer or other programmable apparatus provide processes for implementing the functions/acts specified in the flowchart and/or block diagram block or blocks.

Figure 17:
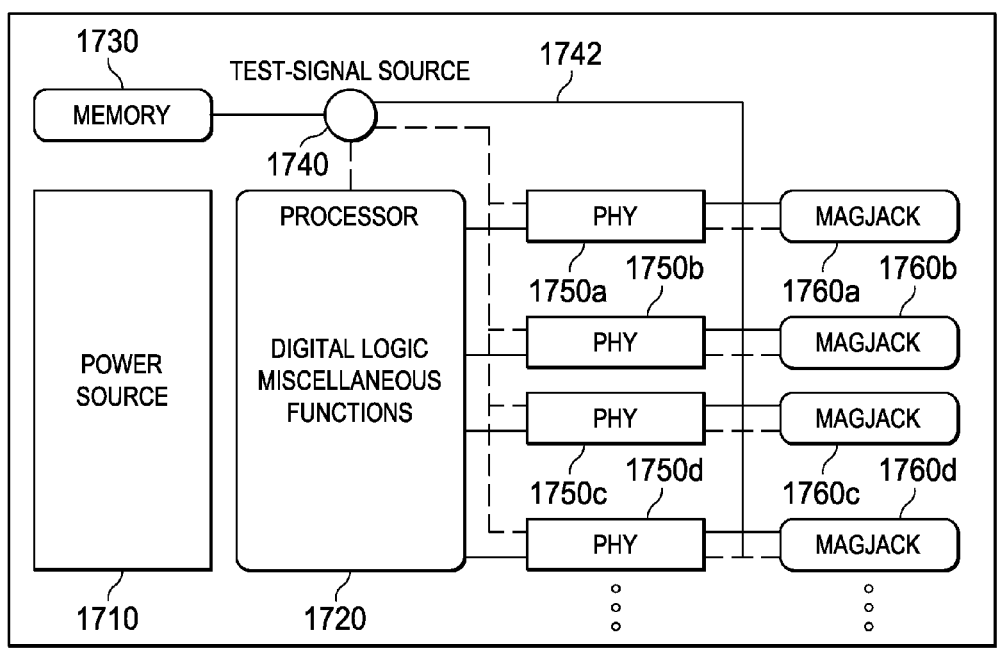
FIG. 17 is a block diagram illustrating an example system for communication channel diagnostics.

FIG. 17 illustrates an example system 1700 for communication channel diagnostics. System 1700 may, for example, be part of a network node (e.g., a switch). System 1700 includes a power source 1710, a processor 1720, a memory 1730, a test-signal source 1740, a number of physical transceivers 1750, and a number of MAGJACKs 1760. Power source 1710 can be configured for providing electrical power (e.g., AC and/or DC) to the various components of system 1700. Processor 1720 can be configured for initiating tests and generating user notifications regarding the results. Memory 1730 can be configured for storing noise data. In particular implementations, the noise data may be stored in the form of a look up table (e.g., versus frequency). In particular implementations, memory 1730 may be a non-volatile memory. Test-signal source 1740 can be configured for generating test signals. Test-signal source 1740 may, for example, be a sine wave generator or any generator capable of executing the protocol signaling. The signals from test-signal source 1740 are fed to MAGJACKs 1760 over a link 1742. Link 1742 may be a shared connection between MAGJACKs 1760 or a direct connection to each MAGJACK 1760. MAGJACKs 1760, which can be a combination of magnetics and connectors, can convert the test signals to different forms for testing and deliver the converted test signal to the channel. As discussed previously, the test signals may be provided to a magnetic (e.g., a transformer) or a line pair. Physical transceivers 1750 are responsible for send and receive functions for messages (e.g., packets). Additionally, their circuitry may be used in diagnostic tests. For example, the physical transceivers may measure the differential conversion (e.g., from common-mode inserted into a channel or from another channel) on its data line differential inputs, which are not shown in this diagram to simplify it.

Thus, test-signal source 1740 is shared among physical transceivers 1750. Test-signal source 1740 may deliver the signals to MAGJACKs 1760 directly or via an analog multiplexer that allows each physical transceiver 1750 access to test-signal source 1740 for sending the common-mode signals. This can allow the physical transceivers and the test-signal source to share the common-mode node. A multiplexer/buffer circuit may be outside the physical transceiver or inside the physical transceiver. Processor 1720 may interface to the local node (e.g., the data switch fabric), which is not shown for the sake simplicity, and initiate the broadcast of start of test packets and/or end of test packets, request exchange of measurement results, display look-up table reference along with measurements on a graphical user interface locally or remotely using a web browser or system command, and/or allow the transfer and exchange of the data stored with a handheld network tester. In some implementations, processor 1720 may also coordinate the notifications needed to be sent to a user or work with another local processor under a protocol to pass such tasks to be handled somewhere else.

In certain modes of operation, processor 1720 may instruct one of physical transceivers 1750 to test its associated channel. For example, processor 1720 may instruct physical transceiver 1750a to insert a common-mode signal on a portion of the associated channel and monitor differential-mode noise on portions of the channel. Additionally, common-mode-to-common-mode coupling on the channel may be monitored. Physical transceiver 1750a may instruct test-signal source 1740 as to the appropriate signal(s) to insert. Physical transceivers 1750 may communication with test-signal source 1740 over a link 1744. Physical transceiver 1750a may also monitor the received differential noise and determine whether the noise is acceptable (e.g., by accessing memory 1730). Additionally, physical transceiver 1750a may report the results of the test to processor 1720 so that is may generate appropriate user notifications.

In some modes of operation, processor 1720 may instruct one of physical transceivers 1750 to test channels associated with the other physical transceivers 1750. For example, processor 1720 may instruct physical transceiver 1750b to insert a common-mode signal on its associated channel. Physical transceiver 1750b may instruct test-signal source 1740 as to the appropriate signal(s) to insert. Additionally, each of physical transceivers 1750 may monitor the received differential noise on their associated channels and determine whether the noise is acceptable (e.g., by accessing memory 1730). Physical transceivers 1750 may report the results of the test to processor 1720 so that is may generate appropriate user notifications. In particular implementations, not only may common-mode to differential-mode coupling be measured between different channels (i.e., port to port), but also common-mode-to-common-mode coupling between channels may be measured.

An alternate approach is to have a single test-signal source inside the system that is delivered to every pin on the physical transceiver, and the physical transceivers buffer it and deliver it to each magnetic placed inside the MAGJACK (typically a magnetic inside an RJ45) or a discrete magnetic.

Figure 18:
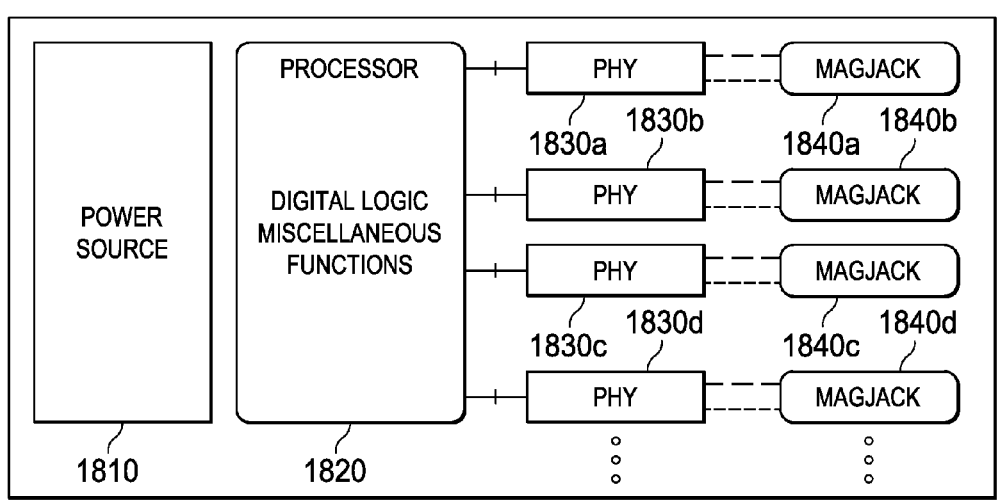
FIG. 18 is a block diagram illustrating an example system for communication channel diagnostics.

FIG. 18 illustrates another example system 1800 for communication channel diagnostics. System 1800 may, for example, be part of a network node (e.g., a switch). System 1800 includes a power source 1810, a processor 1820, a number of physical transceivers 1830, and a number of MAGJACKs 1840. Power source 1810 can be configured for providing electrical power (e.g., AC and/or DC) to the various components of system 1800. Processor 1820 can be configured for initiating tests and generating user notifications regarding the results. Physical transceivers 1830 are responsible for send and receive functions for messages (e.g., packets). Additionally, their circuitry may be used in diagnostic tests. For example, the physical transceivers may be used to source common-mode noise on a channel or a portion therefore and to measure the differential conversion (e.g., from common-mode inserted into a channel or from another channel) on its data line differential inputs, which are not shown in this diagram to simplify it. MAGJACKs 1840 can be a combination of magnetics and connectors. As discussed previously, the test signals may be provided to a magnetic (e.g., a transformer) or a line pair.

Thus, each physical transceiver 1830 implements the test-signal source inside itself independently. For example, physical transceivers 1830 may have an infinite software loop that generates a sine wave using a local digital converter (e.g., D/A) and the local logic circuitry to encode and decode the MAC address onto the common-mode signaling called for in the protocols of this disclosure. Physical transceivers 1830 may share their receive and transmit path circuitry designed for the differential data or allow a switchover mode for the handling common-mode signaling and, at some additional cost, have dedicated common-mode circuitry or a hybrid of both approaches. Each physical transceiver 1830 sources common-mode and measures the differential on its normal data lines.

In certain modes of operation, processor 1820 may instruct one of physical transceivers 1830 to test its associated channel. For example, processor 1820 may instruct physical transceiver 1830b to insert a common-mode signal on a portion of the associated channel and monitor differential-mode noise on one or more portions of the channel. Additionally, common-mode-to-common-mode coupling on the channel may be monitored. Physical transceiver 1830b may source the test signal, monitor the received differential noise, and determine whether the noise is acceptable by accessing a table stored on local memory (e.g., inside the physical transceiver or outside the physical transceiver). Additionally, physical transceiver 1830b may report the results of the test to processor 1820 so that is may generate appropriate user notifications.

In some modes of operation, processor 1820 may instruct one of physical transceivers 1830 to test channels associated with other physical transceivers 1830. For example, processor 1820 may instruct physical transceiver 1830c to insert a common-mode signal on the associated channel. Additionally, each of the other physical transceivers 1830 may monitor the received differential noise on their associated channels and determine whether the noise is acceptable (e.g., by accessing a table). Physical transceivers 1830 may report the results of the test to processor 1820 so that is may generate appropriate user notifications. In particular implementations, not only may common-mode to differential-mode coupling be measured between different channels (i.e., port to port), but also common-mode-to-common-mode coupling between channels may be measured.

The terminology used herein is for the purpose of describing particular implementations only and is not intended to be limiting. As used herein, the singular form "a", "an", and "the" are intended to include the plural forms as well, unless the context clearly indicates otherwise. It will be further understood that the terms "comprises" and/or "comprising," when used in the this specification, specify the presence of stated features, integers, steps, operations, elements, and/or components, but do not preclude the presence or addition of one or more other features, integers, steps, operations, elements, components, and/or groups therefore.

The corresponding structure, materials, acts, and equivalents of all means or steps plus function elements in the claims below are intended to include any structure, material, or act for performing the function in combination with other claimed elements as specifically claimed. The description of the present implementations has been presented for purposes of illustration and description, but is not intended to be exhaustive or limited to the implementations in the form disclosed. Many modifications and variations will be apparent to those of ordinary skill in the art without departing from the scope and spirit of the disclosure. The implementations were chosen and described in order to explain the principles of the disclosure and the practical application and to enable others or ordinary skill in the art to understand the disclosure for various implementations with various modifications as are suited to the particular use contemplated.

A number of implementations have been described for communication channel diagnostics, and several others have been mentioned or suggested. Moreover, those skilled in the art will readily recognize that a variety of additions, deletions, modifications, and substitutions may be made to these implementations while still achieving communication channel diagnostics. Thus, the scope of the protected subject matter should be judged based on the following claims, which may capture one or more aspects of one or more implementations.

What is claimed is:

1. A method comprising:
    inserting a first common-mode signal into a first communication channel from a communication node;
    monitoring differential-mode noise in at least one communication channel resulting from the first common-mode signal;
    determining whether the differential-mode noise is acceptable; and
    generating a user notification if the differential-mode noise is not acceptable.

2. The method of claim 1, wherein monitoring differential-mode noise is performed at a network node and an end node, wherein one of the nodes inserted the first common-mode signal.

3. The method of claim 1, wherein the communication node is a network node and the at least one communication channel comprises one or more communication channels adjacent the first communication channel in which the insertion occurred, and further comprising determining whether the differential-mode noise resulting from the first common-mode signal is acceptable on the adjacent channels.

4. The method of claim 1, further comprising:
    inserting a second common-mode signal into a second communication channel;
    monitoring differential-mode noise in the second communication channel resulting from the second common-mode signal;
    determining whether the differential-mode noise is acceptable; and
    generating a user notification if the differential-mode noise is not acceptable.

5. The method of claim 4, further comprising:
    monitoring differential-mode noise in one or more adjacent communication channels resulting from the second common-mode signal; and
    determining whether the differential-mode noise is acceptable in the one or more adjacent communication channels.

6. The method of claim 4, further comprising inserting the first and second common-mode signals at the same time.

7. The method of claim 6, further comprising:
    delivering the first and second common-mode signals to the channels from a common source that is shared among the channels; and
    performing the monitoring with physical transceivers used for data messaging.

8. The method of claim 1, further comprising monitoring common-mode noise on the first communication channel in which the insertion occurred.

9. The method of claim 8, wherein the monitoring the common-mode noise and the monitoring the differential-mode noise are performed by a physical transceiver that is capable of buffering an external source.

10. The method of claim 1, wherein the first common-mode signal is of relatively short duration to minimize data corruption on communication channels adjacent to the first communication channel in which the insertion occurred.

11. The method of claim 10, wherein the first common-mode signal is sinusoidal and can operate simultaneously with active data on one or more communication channels.

12. The method of claim 10, wherein the first common-mode signal comprises a signature that allows the differential-mode noise generated from the first common-mode signal to be distinguished from data on the at least one communication channel.

13. The method of claim 1, further comprising sending a port identifier through the first communication channel in which the insertion occurred before initiating the insertion.

14. The method of claim 13, further comprising:
determining whether a message has been received to stop inserting a common-mode signal; and
stopping the insertion of a common-mode signal if a message has been received.

15. The method of claim 1, further comprising sending a test protocol signal to inform another communication node regarding the frequency of the first common-mode signal.

16. The method of claim 1, further comprising:
inserting a second common-mode signal into a second communication channel from the communication node;
monitoring differential-mode noise in the second communication channel in which the insertion occurred resulting from the second common-mode signal;
monitoring differential-mode noise in at least one adjacent communication channel resulting from the second common-mode signal; and
determining whether differential-mode cross talk between the second communication channel and the at least one adjacent communication channel is acceptable.

17. The method of claim 1, comprising:
inserting a differential-mode signal into a second communication channel;
monitoring differential-mode noise in the communication channel in which the insertion occurred resulting from the differential-mode signal;
monitoring differential-mode noise in at least one adjacent communication channel resulting from the differential-mode signal; and
determining whether differential-mode cross talk between the second communication channel and the at least one adjacent communication channel is acceptable.

18. The method of claim 17, wherein the first common-mode signal and the differential-mode signal are inserted at the same time.

19. The method of claim 17, wherein the differential-mode signal comprises a signature that allows the differential-mode noise generated from the differential-mode signal to be distinguished from data on the at least one adjacent communication channel.

20. Logic encoded in non-transitory computer-readable media that includes code for execution and when executed by a processor is operable to perform operations comprising:
inserting a common-mode signal into a communication channel from a communication node;
monitoring differential-mode noise in at least one communication channel resulting from the common-mode signal;
determining whether the differential-mode noise is acceptable; and
generating a user notification if the differential-mode noise is not acceptable.

21. A system in a communication node, the system comprising:
a circuit adapted to insert a first common-mode signal into a first communication channel; and
a physical transceiver adapted to control insertion of the first common-mode signal, monitor differential-mode noise in at least one communication channel resulting from the first common-mode signal, and determine whether the differential-mode noise is acceptable.

22. The system of claim 21, wherein the physical transceiver is further adapted to analyze differential-noise measurements from a communication node on another end of the communication channel to determine whether the differential-mode noise is acceptable.

23. The system of claim 21, wherein the communication node is a network node that is further adapted to monitor differential-mode noise on one or more communication channels adjacent the first communication channel in which the insertion occurred and determine whether the differential-mode noise resulting from the first common-mode signal is acceptable on the one or more adjacent communication channels.

24. The system of claim 21, wherein the communication node is further adapted to insert a second common-mode signal in a second communication channel, monitor differential-mode noise in the second communication channel resulting from the second common-mode signal, and determine whether the differential-mode noise is acceptable.

25. The system of claim 24, wherein the communication node is further adapted to monitor differential-mode noise on one or more communication channels adjacent the second communication channel and determine whether the differential-mode noise resulting from the second common-mode signal is acceptable on the one or more adjacent channels.

26. The system of claim 24, wherein the communication node is further adapted to insert the first and second common-mode signals at the same time.

27. The system of claim 24, further comprising a test-signal source adapted to deliver the first and second common-mode signals to the first and second communication channels, respectively, and the communication node is further adapted to perform the monitoring with physical transceivers used for data messaging.

28. The system of claim 21, wherein the first common-mode signal is of relatively short duration and minimizes data corruption on communication channels adjacent to the first communication channel in which the insertion occurred.

29. The system of claim 28, wherein the first common-mode signal comprises a signature that allows differential-mode noise generated from the first common-mode signal to be distinguished from data on a communication channel.

30. The system of claim 21, wherein the communication node is further adapted to send a port identifier through the first communication channel in which the insertion occurred before initiating the insertion.

31. The system of claim 30, wherein the communication node is further adapted to determine whether a message has been received to stop inserting a common-mode signal and to stop the insertion of a common-mode signal if a message has been received.

32. The system of claim 31, wherein the communication node is further adapted to send a test protocol signal to inform another communication node regarding the frequency of a common-mode signal, wherein the communication node is adapted to establish a notch at the frequency and remove a notch at an earlier frequency.

33. The system of claim 21, wherein:
the physical transceiver is further adapted to insert a third common-mode signal into one of the communication channels and monitor differential-mode noise in the one of the communication channels resulting from the third common-mode signal; and the communication node is further adapted to monitor differential-mode noise in at least one adjacent communication channel resulting from the third common-mode signal, and determine whether differential-mode cross talk between the one of the communication channels and the at least one adjacent communication channel is acceptable.

34. The system of claim 21, wherein:

the physical transceiver is further adapted to insert a differential-mode signal into one of the communication channels and monitor differential-mode noise in the one of the communication channels resulting from the differential-mode signal; and the communication node is further adapted to monitor differential-mode noise in at least one adjacent communication channel resulting from the differential-mode signal, and determine whether the differential-mode cross talk between the one of the communication channels and the at least one adjacent communication channel is acceptable.

35. The system of claim 34, wherein the physical transceiver is adapted to insert the common-mode signal and the differential-mode signal at the same time.

36. The system of claim 34, wherein the communication node is further adapted to:

insert a second differential-mode signal into a second communication channel;

monitor differential-mode noise in the second communication channel resulting from the second differential-mode signal;

monitor differential-mode noise in at least one adjacent communication channel resulting from the second differential-mode signal; and determine whether the differential-mode cross talk between the second d communication channel and the at least one adjacent communication channel is acceptable.

37. The system of claim 34, wherein the differential-mode signal comprises a signature that allows the differential-mode noise generated from the differential-mode signal to be distinguished from data on a communication channel.

* * * * *